US010263762B2

(12) United States Patent
Chang et al.

(10) Patent No.: US 10,263,762 B2
(45) Date of Patent: Apr. 16, 2019

(54) PHYSICAL LAYER CIRCUITRY FOR MULTI-WIRE INTERFACE

(71) Applicant: M31 Technology Corporation, Hsinchu County (TW)

(72) Inventors: Ching-Hsiang Chang, Taipei (TW); Yuan-Hsun Chang, Hsinchu County (TW); Yueh-Chuan Lu, New Taipei (TW); Huai-Te Wang, Hsinchu County (TW)

(73) Assignee: M31 Technology Corporation, Hsinchu County (TW)

( * ) Notice: Subject to any disclaimer, the term of this patent is extended or adjusted under 35 U.S.C. 154(b) by 0 days.

(21) Appl. No.: 16/039,348

(22) Filed: Jul. 19, 2018

(65) Prior Publication Data
US 2018/0323952 A1 Nov. 8, 2018

Related U.S. Application Data

(63) Continuation-in-part of application No. 15/956,709, filed on Apr. 18, 2018, and a continuation-in-part of application No. 15/616,937, filed on Jun. 8, 2017.
(Continued)

(51) Int. Cl.
| G06F 5/00 | (2006.01) |
| H04L 7/00 | (2006.01) |
| H03K 19/21 | (2006.01) |
| H03K 3/037 | (2006.01) |
| H03K 7/08 | (2006.01) |
| G04F 10/00 | (2006.01) |
| H03F 3/45 | (2006.01) |
| G06F 1/06 | (2006.01) |
| H03K 5/14 | (2014.01) |
| H03M 7/00 | (2006.01) |
| H04M 1/38 | (2006.01) |

(Continued)

(52) U.S. Cl.
CPC .......... *H04L 7/0016* (2013.01); *G04F 10/005* (2013.01); *G06F 1/06* (2013.01); *H03F 3/45475* (2013.01); *H03K 3/037* (2013.01); *H03K 5/14* (2013.01); *H03K 7/08* (2013.01); *H03K 19/21* (2013.01); *H03F 2200/129* (2013.01); *H03F 2203/45116* (2013.01); *H03F 2203/45594* (2013.01); *H03M 7/00* (2013.01); *H04B 1/00* (2013.01); *H04B 1/40* (2013.01); *H04B 1/581* (2013.01); *H04B 3/00* (2013.01); *H04M 1/38* (2013.01)

(58) Field of Classification Search
CPC .. H03M 7/00; H04B 1/38; H04B 1/40; H04B 3/00; H04B 1/581; H04B 1/00; H04B 1/0003
USPC .......... 341/55; 375/219, 220, 222, 257, 258, 375/316, 295; 713/400
See application file for complete search history.

(56) References Cited

U.S. PATENT DOCUMENTS 6,215,816 B1 * 4/2001 Gillespie ................. H04L 12/44
370/402
2015/0370305 A1 12/2015 Wietfeldt

FOREIGN PATENT DOCUMENTS

| CN | 1427474 A | 7/2003 |
| CN | 104581151 A | 4/2015 |
| WO | 2017/023526 A1 | 2/2017 |

* cited by examiner

*Primary Examiner* — Joseph J Lauture
(74) *Attorney, Agent, or Firm* — Winston Hsu

(57) ABSTRACT

The present invention provides pad arrangements, termination circuits, clock/data recovery circuits, and deserialization architecture for a physical layer circuitry including a
(Continued)

four-signal or six-signal physical medium attachment sublayer (PMA).

18 Claims, 22 Drawing Sheets

Related U.S. Application Data

(60) Provisional application No. 62/534,209, filed on Jul. 19, 2017, provisional application No. 62/590,352, filed on Nov. 23, 2017, provisional application No. 62/461,247, filed on Feb. 21, 2017.

(51) Int. Cl.
*H04B 1/40* (2015.01)
*H04B 1/58* (2006.01)
*H04B 3/00* (2006.01)
*H04B 1/00* (2006.01)

PHYSICAL LAYER CIRCUITRY FOR MULTI-WIRE INTERFACE

CROSS REFERENCE TO RELATED APPLICATIONS

This application claims the benefit of U.S. Provisional Application No. 62/534,209, filed on Jul. 19, 2017. This application is also a continuation-in-part of U.S. patent application Ser. No. 15/956,709, filed on Apr. 18, 2018, which claims the benefit of U.S. Provisional Application No. 62/590,352, filed on Nov. 23, 2017. This application is also a continuation-in-part of U.S. patent application Ser. No. 15/616,937, filed on Jun. 8, 2017, which claims the benefit of U.S. Provisional Application No. 62/461,247, filed on Feb. 21, 2017. The entire contents of the related applications are incorporated herein by reference.

BACKGROUND OF THE INVENTION

1. Field of the Invention

The present invention relates to a multi-wire data interface, and more particularly to, physical layer circuitry and physical medium attachment sublayer adaptable to different PHY modes of the multi-wire data interface.

2. Description of the Prior Art

Mobile devices, such as smartphones, include a variety of components for different purposes, such as, application processors, displays, CMOS image sensors. These components need to be interconnected by physical interface. For example, the application processor may provide pixel data to the display through an interface for presenting visual contents. Alternatively, the CMOS image sensors may provide sensed image data to the application processor through a multi-wire interface for exporting photos or videos.

The Mobile Industry Processor Interface (MIPI) specifications, which are standardized by the MIPI alliance, are widely used for signal communications and data transfer between the above mentioned components in the mobile devices. MIPI D-PHY is one of the MIPI specifications. In MIPI D-PHY interfacing, communications are achieved with one clock lane and one to four data lanes. Each data lane includes a differential pair of signals and the clock lane is used to transmit a differential clock signal, and each data lane is used to transmit a differential data signal.

In order to meet requirement of high-speed transmission of specific data, such as, image data, the MIPI C-PHY specification is newly developed and defined. In a MIPI C-PHY interfacing, communications are achieved with three signal wires. The signal wires respectively transmit three-valued signals and the three-valued signals can be converted into a binary logic signal. One feature of MIPI C-PHY is that the clock is embedded in data signals, and the receiver side performs clock and data recovery in receiving the data signals.

Although the MIPI C-PHY effectively can achieve high-speed signal communications and can provide high throughput, it is not necessary to all the components and requirements in the mobile devices. Hence, it would be desirable if vendors can provide functional blocks and/or integrated circuits that are adaptable to both of these two specifications. Accordingly, there is a need for providing an integrated circuits or semiconductor devices supporting both of the MIPI D-PHY and MIPI C-PHY specifications.

SUMMARY OF THE INVENTION

It is one objective of the present invention to provide physical layer circuitry (PHY), and multi-signal physical medium attachment sublayer (PMA) that are adaptable to different PHY modes of a multi-wire interface. Designs of the proposed PHY and PMA have taken differences between signaling characteristics of different PHY modes, such as, MIPI D-PHY and C-PHY taken into consideration. This achieves an implementation of a combo PHY device can seamlessly interface with MIPI D-PHY based devices or MIPI C-PHY based devices.

According to one embodiment of the present invention, a physical layer circuitry (PHY) is provided. The PHY comprises: four signal pads and a four-signal physical medium attachment sublayer (PMA). The four-signal PMA is coupled to the four signal pads and comprises: a four-signal termination circuit coupled to the four signal pads; a first differential amplifier coupled to a first signal pad and a second signal pad, arranged to receive signals on the first signal pad and the second signal pad and accordingly output a first differential signal; a second differential amplifier coupled to the first signal pad and a third signal pad, arranged to signals on the first signal pad and the third signal pad and accordingly output a second differential signal; a third differential amplifier coupled to two switches, selectively coupled to the second signal pad and the third pad signal or the third signal pad and a fourth signal pad, arranged to receive signals on the second signal pad and the third signal pad or the third signal pad and the fourth signal pad and accordingly output a third differential signal; a first signal processing block coupled to the first differential amplifier, arranged to process the first differential signal when the four-signal PMA is operated in a first PHY mode; a second signal processing block coupled to the first, second and third differential amplifiers, arranged to process the first, second and third differential signals when the four-signal PMA is operated in a second PHY mode; and a third signal processing block coupled to the third differential amplifier, arranged to process the third differential signal when the four-signal PMA is operated in the first PHY mode.

According to one embodiment of the present invention, a physical layer circuitry (PHY) is provided. The PHY comprises: six signal pads and a six-signal physical medium attachment sublayer (PMA). The six-signal PMA is coupled to the six signal pads and comprises: a six-signal termination circuit coupled to the six signal pads respectively; a first differential amplifier coupled to a first signal pad and a second signal pad, arranged to receive signals on the first signal pad and the second signal pad and output a first differential signal; a second differential amplifier coupled to the first signal pad and a third signal pad, arranged to receive signals on the first signal pad and the third signal pad and output a second differential signal; a third differential amplifier coupled to two switches, selectively coupled to the second signal pad and the third signal pad or the third signal pad and a fourth signal pad, arranged to receive signals on the second signal pad and the third signal pad or the third signal pad and the fourth signal pad and output a third differential signal; a fourth differential amplifier coupled to the fourth signal pad and a fifth signal pad, arranged to receive signals on the fourth signal pad and the fifth signal pad and output a fourth differential signal; a fifth differential amplifier coupled to the fourth signal pad and a sixth signal pad, arranged to receive signals on the fourth signal pad and the sixth signal pad and output a fifth differential signal; a sixth differential amplifier coupled to the fifth signal pad and the sixth signal pad, arranged to receive signals on the fifth signal pad and the sixth signal pad and output a sixth differential signal; a first signal processing block coupled to the first differential amplifier, arranged to process the first differential signal when the six-signal PMA is operated in a first PHY mode; a second signal processing block coupled to the first, second and third differential amplifiers, arranged to process the first, second and third differential signals when the six-signal PMA is operated in a second PHY mode; and a third signal processing block coupled to the third differential amplifier, arranged to process the third differential signal when the six-signal PMA is operated in the first PHY mode; a fourth signal processing block coupled to the fourth, fifth and sixth differential amplifiers, arranged to process the fourth, fifth and sixth differential signals when the six-signal PMA is operated in the second PHY mode; and a fifth signal processing block coupled to the sixth differential amplifier, arranged to process the sixth differential signal when the six-signal PMA is operated in the first PHY mode.

According to one embodiment of the present invention, a clock and data recovery circuit for a multi-wire interface is provided. The clock and data recovery circuit comprises: a plurality of XOR gates; a plurality of latches; an OR gate and a duty cycle correction unit. Each of the plurality of XOR gates is coupled to one wire of the multi-wire interface and has a normal input and a delay input with a delay element, wherein each XOR gate receives a same signal on the wire from the normal input and the delay input and performs an XOR operation on the received signal and a delay version of the received signal, thereby to output an XOR output signal. Each of the latches is coupled to one of the XOR gates and arranged latch a predetermined signal according to one of XOR output signals to output a latch output signal, wherein the latches are resettable by a reset control signal. The OR gate is coupled to latches, and arranged to perform an OR operation on latch output signals to output a clock signal. The duty cycle correction unit is coupled to the OR gate, and arranged to generate the reset control signal according to the clock signal, wherein the clock signal has a duty cycle of around 50%.

According to one embodiment of the present invention, a CDR circuit for a multi-wire interface is provided. The CDR circuit comprises: a plurality of XOR gates, each coupled to one wire of the multi-wire interface and each having a normal input and a delay input with a delay element, wherein each XOR gate receives a same signal on the wire from the normal input and the delay input and performs an XOR operation on the received signal and a delay version of the received signal, thereby to output an XOR output signal; a plurality of latches, each coupled to one of the XOR gates and arranged latch a predetermined signal according to one of XOR output signals to output a latch output signal, wherein the latches are resettable by a reset control signal; an OR gate coupled to latches, arranged to perform an OR operation on latch output signals to output a clock signal; and a delay adjustment unit, coupled to the OR gate, arranged to generate the reset control signal according to a plurality of output signals of a plurality of sampling unit.

These and other objectives of the present invention will no doubt become obvious to those of ordinary skill in the art after reading the following detailed description of the preferred embodiment that is illustrated in the various figures and drawings.

DETAILED DESCRIPTION

In the following description, numerous specific details are set forth to provide a thorough understanding of embodiments of the invention. One skilled in the relevant art will recognize, however, that the invention can be practiced without one or more of the specific details, or with other methods, components, materials, etc. In other instances, well-known structures, materials, or operations are not shown or described in detail to avoid obscuring aspects of the invention.

Reference throughout this specification to "one embodiment" or "an embodiment" means that a particular feature, structure, or characteristic described in connection with the embodiment is included in at least one embodiment of the present invention. Thus, the appearances of the phrases "in one embodiment" or "in an embodiment" in various places throughout this specification are not necessarily all referring to the same embodiment. Furthermore, the particular features, structures, or characteristics may be combined in any suitable manner in one or more embodiments.

The present invention mainly provides four-signal physical medium attachment sublayer (PMA) and/or six-signal PMA in a physical layer circuitry (PHY) at a receiver that are intended for interfacing to the communication link conforming to the MIPI C-PHY or other types of PHY standard utilizes three signal wires to represent a lane or a channel (; hereinafter as three-wire lane PHY) and MIPI D-PHY or other types of PHY standard utilizes two signal wires to represent a lane or a channel (; hereinafter as two-wire lane PHY). In embodiments of the present invention, the four-signal PMA and the six-signal PMA could be implemented in the form of intellectual Property (IP) cores, IP blocks, or functional blocks that enhance design productivity and make development of highly complex integrated circuits manageable.

Both of the four-signal PMA and the six-signal PMA of the present invention can be configured and operated in one of the MIPI D-PHY mode (or other types of two-wire lane PHY mode) and the MIPI C-PHY mode (or other types of three-wire lane PHY mode). For each of them, the four-signal PMA can provide two "two-wire" lanes or one "three-wire" lane for a communication link, while the six-signal PMA can provide three "two-wire" lanes or two "three-wire" lane for a communication link.

Due to signaling characteristics of these different PHY modes, different signal processing procedure/hardware sources are needed to process signals conforming to different PHY standards. As described in the following, the present invention provides pad arrangement, termination circuit, deserialization architecture and clock/data recovery circuit for the four-signal and six-signal PMAs.

Overview

Figure 1:
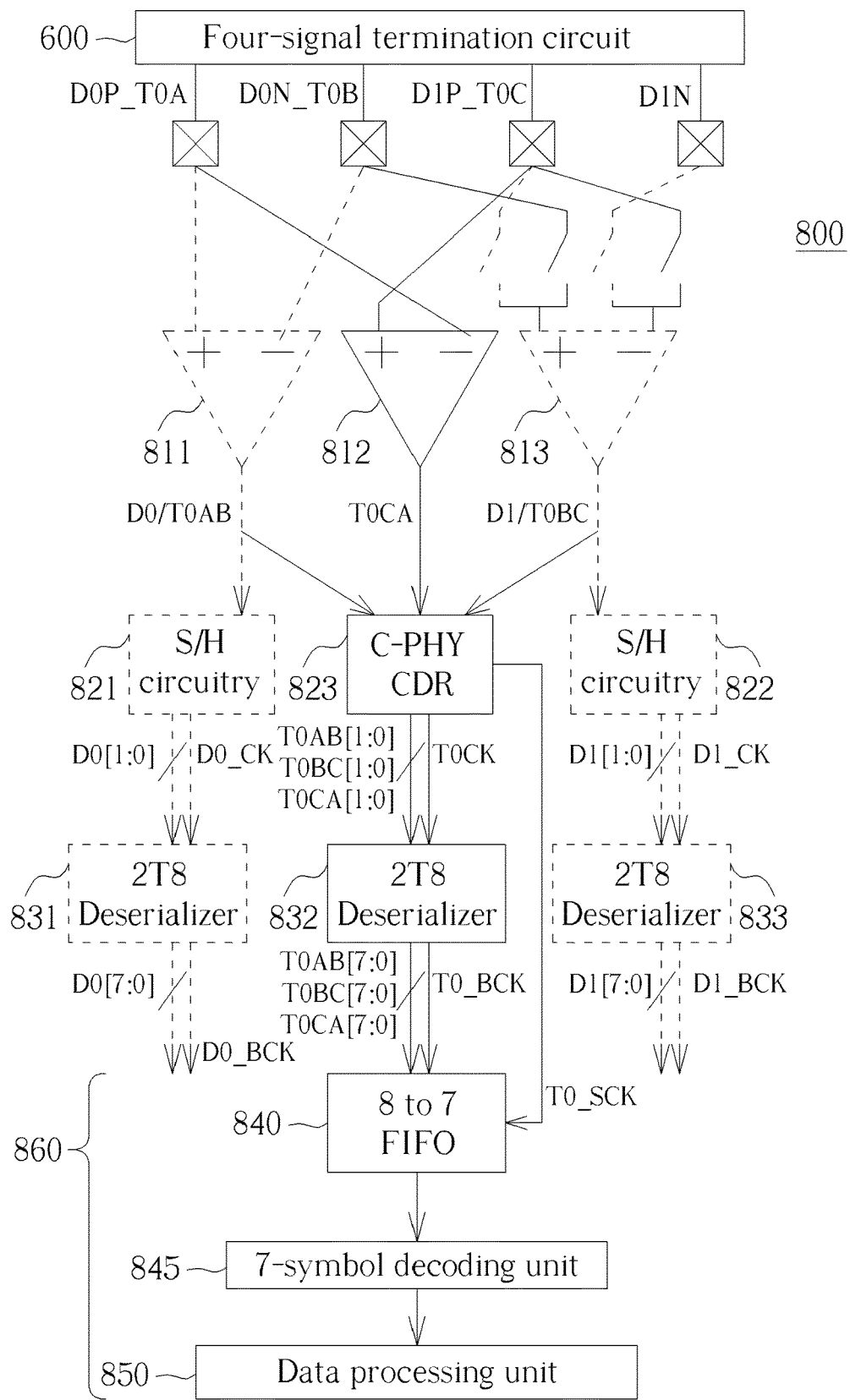
FIG. 1 illustrates a PHY including a four-signal PMA supporting two-wire lane PHY mode and three-wire lane mode according to one embodiment of the present invention.

Please refer to FIG. 1, which illustrates a schematic diagram of a portion of a physical layer circuitry (PHY) according to one embodiment of the present invention. As illustrated, the PHY comprises a four-signal physical medium attachment sublayer (PMA) 800 and four signal pads D0P_T0A, D0N_T0B, D1P_T0C and D1N, and a four-signal termination circuit 600. The signal pads D0P_T0A, D0N_T0B, D1P_T0C and D1N are coupled to the DAs 811-813 of the four-signal PMA 800, respectively. The termination circuit 600 is also coupled to the signal pads D0P_T0A, D0N_T0B, D1P_T0C and D1N, respectively. Thus, the DAs 811-813 are coupled to the termination circuit 600, respectively.

Typically, the four-signal PMA 800 in the embodiment supports two-wire lane PHY (e.g. D-PHY) mode and three-wire lane PHY (e.g. C-PHY) mode. When the four-signal PMA 800 is configured as and operated in the D-PHY mode for a D-PHY based communication link, it can support 2 two-wire lanes, the pads D0P_T0A and D0N_T0B are wired to a first two-wire lane, while the pads D1P_T0C, and D1N are wired to a second two-wire lane. Alternatively, when the four-signal PMA 800 is configured as and operated in C-PHY mode for the C-PHY based communication link, the pads D0P_T0A, D0N_T0B and D1P_T0C are wired to a three-wire lane.

In the case of D-PHY mode/communication link, the pads D0P_T0A and D0N_T0B are coupled to the differential amplifier (DA) 811 and the DA 811 outputs the differential signal D0 based on difference between signals on the signal pads D0P_T0A and D0N_T0B. The pads D1P_T0C and D1N are coupled to the DA 813 through switches and the DA 813 outputs the differential signal D1 based on difference between signals on the signal pads D1P_T0C and D1N. Furthermore, a first signal processing block is coupled to the DA 811, and arranged to process the differential signal D0 when the four-signal PMA 800 is operated in the MIPI D-PHY mode. A third signal processing block is coupled to the DA 813, and arranged to process the differential signal D1 when the four-signal PMA 800 is operated the MIPI D-PHY mode.

In one embodiment, the first signal processing block includes at least sample-and-hold (S/H) circuitry 821. The S/H circuitry 821 produces a serial data signal D0 [1:0] and a clock signal D0_CK according to the signal D0. The third signal processing block includes at least a S/H circuitry 823 and the S/H circuitry 823 produces produce a serial data signal D1 [1:0] and a clock signal D1_CK according to the signal D1.

In one embodiment, the first signal processing block may further comprise a 2-to-8 deserializer 831 which is coupled to the S/H circuitry 821. The S/H circuitry 821 outputs the data signal D0 [1:0] and the clock signal D0_CK to the 2-to-8 deserializer 831. The 2-to-8 de-serializes 831 de-serializes them to produce a plurality of parallel data signals D0 [7:0] and a clock signal D0_BCK. The third signal processing block may further comprise a 2-to-8 deserializer 833 which is coupled to the S/H circuitry 823. The S/H circuitry 823 outputs the data signal D1 [1:0] and the clock signal D1_CK to the 2-to-8 deserializer 833. The 2-to-8 deserializer 833 de-serializes them to produce a plurality of parallel data signals D1 [7:0] and a clock signal D1_BCK.

In the case of C-PHY mode/communication link, the pads D0P_T0A, D0N_T0B and D1P_T0C are coupled to the DAs 811-813. The DA 811 outputs a differential signal T0AB based on difference between signals on D0P_T0A and D0N_T0B. The DA 812 outputs a differential signal T0CA based on difference between signals on D1P_T0C and D0P_T0A. The DA 813 outputs a differential signal T0BC based on difference between signals on D0P_T0B and D1P_T0C. The DAs 811-813 are coupled to a second signal processing block. The second signal processing block is arranged to process the differential signals T0AB, T0BC and T0CA when the four-signal PMA is operated in the MIPI C-PHY mode.

In one embodiment, the second signal processing block comprises at least a C-PHY clock and data recovery (CDR) circuit 822 and the C-PHY CDR circuit 822 accordingly produces a set of serial data signals T0AB [1:0], T0BC [1:0], T0CA [1:0] and a corresponding clock signal T0_CK according to the signals T0AB, T0BC and T0CA.

In one embodiment, the second signal processing block may further comprise a 2-to-8 deserializer 832 which is coupled to the C-PHY CDR circuit 822. The C-PHY CDR circuit 822 outputs signals T0AB [1:0], T0BC [1:0], T0CA [1:0] and T0_CK to the 2-to-8 deserializer 832. The 2-to-8 deserializer 832 de-serializes the signals T0AB [1:0], T0BC [1:0], T0CA [1:0] according to the clock signal T0CK, thereby to produce a set of parallel data signals T0AB [7:0], T0BC [7:0], T0CA [7:0], and a corresponding clock signal T0_BCK.

The 2-to-8 deserializer 832 is further coupled to the 8-to-7 FIFO 840, and the 8-to-7 FIFO 840 converts the 8-bit data signals T0AB [7:0], T0BC [7:0], T0CA [7:0] into 7 bit long. The 8-to-7 FIFO 840 is coupled to a 7-symbol decoding unit 845. The 7-symbol decoding unit 845 is arranged to decode data signals read from the 8-to-7 FIFO 840 thereby to generate data symbols. The 7-symbol decoding unit 845 is coupled to a data processing unit 850. The data processing unit 850 is arranged to process the data symbols outputted by the 7-symbol decoding unit 845. The data processing unit 850 may comprise a 7-symbol to 16-bit demapper, which is arranged to demap every 7 symbols received from the 7-symbol decoding unit 845 into a 16-bit data word.

Moreover, the 8-to-7 FIFO 840, the 7-symbol decoding unit 845 and the data processing unit 850 collectively function as a C-PHY decoding processor 860 in the four-signal PMA 800. In addition, the sequence of the 8-to-7 FIFO and the 7-symbol decoding unit in the four-signal PMA is interchangeable. According to various embodiment of the preset invention, the symbol decoding unit could be prior to the FIFO (could be identical to the sequence disclosed in Applicant's patent application Ser. No. 15/956, 709).

As the four-signal PMA 800 may not be operated in both the D-PHY mode and the C-PHY mode simultaneously, the number of the 2-to-8 deserializers deployed in the four-signal PMA 800 can be decreased. Please refer to FIG. 2 for better understandings. When operated D-PHY mode, the S/H circuitry 1110 and 1112 may share a same 2-to-8 deserializer 1120, and the 2-to-8 deserializer 1120 de-serializes the data signals D0 [1:0] and D1 [1:0] according to clock signals D0_CK and D1_CK, respectively. On the other hand, when operated in C-PHY mode, the C-PHY CDR circuit 1111 only needs one 2-to-8 deserializer 1120, and the 2-to-8 deserializer 1120 de-serializes the data signals T0AB [1:0], T0BC [1:0] and T0CA [1:0] according to clock signals T0_CK, respectively. Compared to three separate deserializer 831-833 needed by four-signal PMA 800 of FIG. 1, such implementation significantly improves circuit area efficiency.

Figure 3:
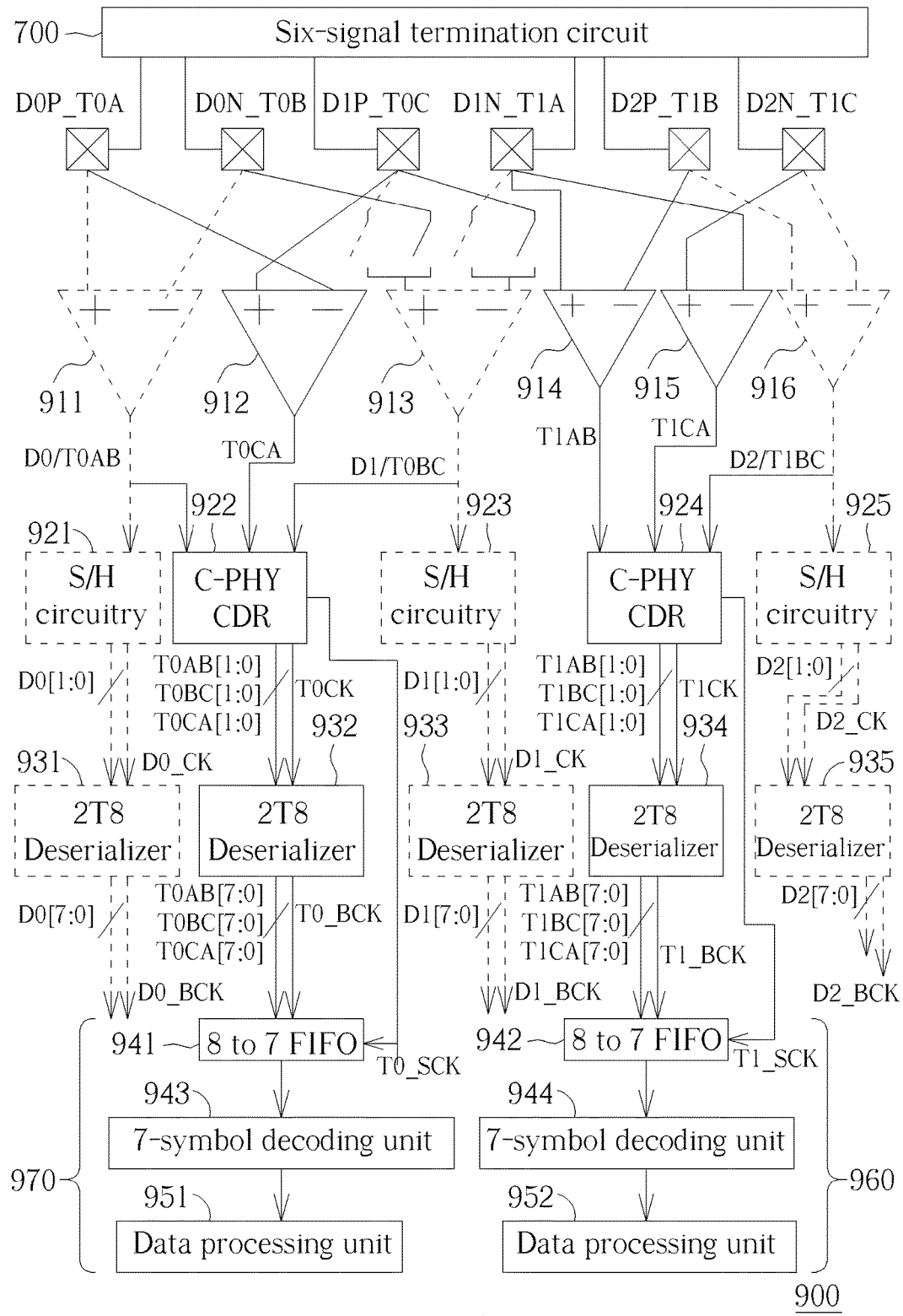
FIG. 3 illustrates a PHY including a six-signal PMA block supporting two-wire lane PHY mode and three-wire lane mode according to one embodiment of the present invention.

Another example of the PHY of the present invention that can support both D-PHY communication link and C-PHY communication link is illustrated in FIG. 3. As illustrated, the PHY in FIG. 3 comprises a six-signal PMA 900, signal pads D0P_T0A, D0N_T0B, D1P_T0C, D1N_T1A, D2P_T1B and D2N_T1C and a six-signal termination circuit 700. The signal pads D0P_T0A, D0N_T0B, D1P_T0C, D1N_T1A, D2P_T1B and D2N_T1C are coupled to the DAs 911-916 of the six-signal PMA 900, respectively. The termination circuit 700 is also coupled to the signal pads D0P_T0A, D0N_T0B, D1P_T0C, D1N_T1A, D2P_T1B and D2N_T1C, respectively. Thus, the DAs 911-916 are coupled to the termination circuit 700, respectively.

When the six-signal PMA 900 is configured as and operated in D-PHY mode for a D-PHY based communication link, the pads D0P_T0A and D0N_T0B are wired to a first two-wire lane of the D-PHY communication link, the pads D1P_T0C, and D1N_T1A are wired to a second two-wire lane of the D-PHY communication link and the pads D2P_T1C and D2N_T1C are wired to a third two-wire lane of the D-PHY communication link. Alternatively, when the six-signal PMA 900 is configured as and operated in a C-PHY mode for a C-PHY based communication link, the pads D0P_T0A, D0N_T0B and D1P_T0C are wired to a first three-wire lane of the C-PHY communication link and the pads D1N_T1A, D2P_T1B and D2N_T1C are wired to a second three-wire lane of C-PHY communication link.

In the case of the D-PHY mode/communication link, the pads D0P_T0A and D0N_T0B are coupled to DA 911 and the DA 911 outputs the differential signal D0 based on a difference between signals on the pads D0P_T0A and D0N_T0B. The pads D1P_T0C and D1N_T1A are coupled to DA 913 through switches and the DA 913 outputs the differential signal D1 based on a difference between signals on the pads D1P_T0C and D1N_T1A. The pads D2P_T1B and D2N_T1C are coupled to DA 916 through switches and the DA 916 outputs the differential signal D2 based on a difference between signals on the pads D2P_T1B and D2N_T1C. Furthermore, a first signal processing block is coupled to the DA 911, and arranged to process the differential signal D0 when the six-signal PMA 900 is operated in the MIPI D-PHY mode. A third signal processing block is coupled to the DA 913, and arranged to process the differential signal D1 when the six-signal PMA 900 is operated the MIPI D-PHY mode. A fifth signal processing block is coupled to the DA 916, and arranged to process the differential signal D2 when the six-signal PMA 900 is operated the MIPI D-PHY mode.

In one embodiment, the first signal processing block includes at least sample-and-hold (S/H) circuitry 921. The S/H circuitry 921 produces a serial data signal D0 [1:0] and a clock signal D0_CK according to the signal D0. The third signal processing block includes at least a S/H circuitry 923 and the S/H circuitry 923 produces produce a serial data signal D1 [1:0] and a clock signal D1_CK according to the signal D1. The fifth signal processing block includes at least a S/H circuitry 925 and the S/H circuitry 925 produces produce a serial data signal D2 [1:0] and a clock signal D2_CK according to the signal D2.

In one embodiment, the first signal processing block may further comprise a 2-to-8 deserializer 931 which is coupled to the S/H circuitry 921. The S/H circuitry 921 outputs the data signal D0 [1:0] and the clock signal D0_CK to the 2-to-8 deserializer 931. The 2-to-8 de-serializes 931 de-serializes them to produce a plurality of parallel data signals D0 [7:0] and a clock signal D0_BCK. The third signal processing block may further comprise a 2-to-8 deserializer 933 which is coupled to the S/H circuitry 923. The S/H circuitry 923 outputs the data signal D1 [1:0] and the clock signal D1_CK to the 2-to-8 deserializer 933. The 2-to-8 deserializer 933 de-serializes them to produce a plurality of parallel data signals D1 [7:0] and a clock signal D1_BCK. The fifth signal processing block may further comprise a 2-to-8 deserializer 935 which is coupled to the S/H circuitry 925. The S/H circuitry 925 outputs the data signal D2 [1:0] and the clock signal D2_CK to the 2-to-8 deserializer 935. The 2-to-8 deserializer 935 de-serializes them to produce a plurality of parallel data signals D2 [7:0] and a clock signal D2_BCK.

In the case of the C-PHY mode/communication link, the pads D0P_T0A and D0N_T0B are coupled to DA 911 and the DA 911 outputs the differential signal T0AB based on a difference between signals on the pads D0P_T0A and D0N_T0B. The pads D0P_T0A and D1P_T0C are coupled to DA 912 and the DA 912 outputs the differential signal T0CA based on a difference between signals on the pads D0P_T0A and D1P_T0C. The pads D1P_T0C and D0N_T0B are coupled to DA 913 through switches and the DA 913 outputs the differential signal T0BC based on a difference between signals on the pads D1P_T0C and D0N_T0B. The pads D1N_T1A and D2P_T1B are coupled to DA 914 and the DA 914 outputs the differential signal T1AB based on a difference between signals on the pads D1N_T1A and D2P_T1B. The pads D1N_T1A and D2N_T1C are coupled to DA 915 and the DA 915 outputs the differential signal T1CA based on a difference between signals on the pads D1N_T1A and D2N_T1C. The pads D2P_T1B and D2N_T1C are coupled to DA 916 through switches and the DA 916 outputs the differential signal T1BC based on a difference between signals on the pads D2P_T1B and D2N_T1C.

The DAs 911-913 are also coupled to a second signal processing block. The second signal processing block is arranged to process the differential signals T0AB, T0BC and T0CA when the six-signal PMA 900 is operated in the MIPI C-PHY mode. The DAs 914-916 are also coupled to a fourth signal processing block. The fourth signal processing block is arranged to process the differential signals T1AB, T1BC and T1CA when the six-signal PMA 900 is operated in the MIPI C-PHY mode.

In one embodiment, the second signal processing block comprises at least a C-PHY clock and data recovery (CDR) circuit 922, and the C-PHY CDR circuit 922 accordingly produces a set of serial data signals T0AB [1:0], T0BC [1:0], T0CA [1:0] and a corresponding clock signal T0_CK according to the signals T0AB, T0BC and T0CA. The fourth signal processing block comprises at least a C-PHY CDR circuit 924 and the C-PHY CDR circuit 924 accordingly produces a set of serial data signals T1AB [1:0], T1BC [1:0], T1CA [1:0] and a corresponding clock signal T1_CK according to the signals T1AB, T1BC and T1CA.

In one embodiment, the second signal processing block may further comprise a 2-to-8 deserializer 932 which is coupled to the C-PHY CDR circuit 922. The C-PHY CDR circuit 922 outputs signals T0AB [1:0], T0BC [1:0], T0CA [1:0] and T0_CK to the 2-to-8 deserializer 932. The 2-to-8 deserializer 932 de-serializes the signals T0AB [1:0], T0BC [1:0], T0CA [1:0] according to the clock signal T0CK, thereby to produce a set of parallel data signals T0AB [7:0], T0BC [7:0], T0CA [7:0], and a corresponding clock signal T0_BCK. The fourth signal processing block may further comprise a 2-to-8 deserializer 934 which is coupled to the C-PHY CDR circuit 924. The C-PHY CDR circuit 924 outputs signals T1AB [1:0], T1BC [1:0], T1CA [1:0] and T1_CK to the 2-to-8 deserializer 934. The 2-to-8 deserializer 934 de-serializes the signals T1AB [1:0], T1BC [1:0], T1CA [1:0] according to the clock signal T1CK, thereby to produce a set of parallel data signals T1AB [7:0], T1BC [7:0], T1CA [7:0], and a corresponding clock signal T1_BCK.

In one embodiment, the 2-to-8 deserializer 932 is further coupled to the 8-to-7 FIFO 941, and the 8-to-7 FIFO 941 converts the 8-bit data signals T0AB [7:0], T0BC [7:0], T0CA [7:0] into 7 bit long. The 8-to-7 FIFO 941 is coupled to a 7-symbol decoding unit 943. The 7-symbol decoding unit 943 is arranged to decode data signals read from the 8-to-7 FIFO 941 thereby to generate data symbols. The 7-symbol decoding unit 943 is coupled to a data processing unit 951. The data processing unit 951 is arranged to process the data symbols outputted by the 7-symbol decoding unit 943. The data processing unit 951 may comprise a 7-symbol to 16-bit demapper, which is arranged to demap every 7 symbols received from the 7-symbol decoding unit 943 into a 16-bit data word. Moreover, the 8-to-7 FIFO 941, the 7-symbol decoding unit 943 and the data processing unit 951 collectively function as a C-PHY decode processor 960 in the six-signal PMA 900. In addition, the sequence of FIFO and the symbol decoding unit in the six-signal PMA is interchangeable. According to various embodiment of the preset invention, there could be a symbol decoding unit prior to a FIFO (could be identical to the sequence disclosed in Applicant's U.S. patent application Ser. No. 15/956,709).

The 2-to-8 deserializer 934 is further coupled to the 8-to-7 FIFO 942, and the 8-to-7 FIFO 942 converts the 8-bit data signals T1AB [7:0], T1BC [7:0], T1CA [7:0] into 7 bit long. The 8-to-7 FIFO 942 is coupled to a 7-symbol decoding unit 944. The 7-symbol decoding unit 944 is arranged to decode data signals read from the 8-to-7 FIFO 942 thereby to generate data symbols. The 7-symbol decoding unit 944 is coupled to a data processing unit 952. The data processing unit 952 is arranged to process the data symbols outputted by the 7-symbol decoding unit 944. The data processing unit 952 may comprise a 7-symbol to 16-bit demapper, which is arranged to demap every 7 symbols received from the 7-symbol decoding unit 944 into a 16-bit data word. Moreover, the 8-to-7 FIFO 942, the 7-symbol decoding unit 944 and the data processing unit 952 collectively function as another C-PHY decode processor 970 in the six-signal PMA 900.

Figure 2:
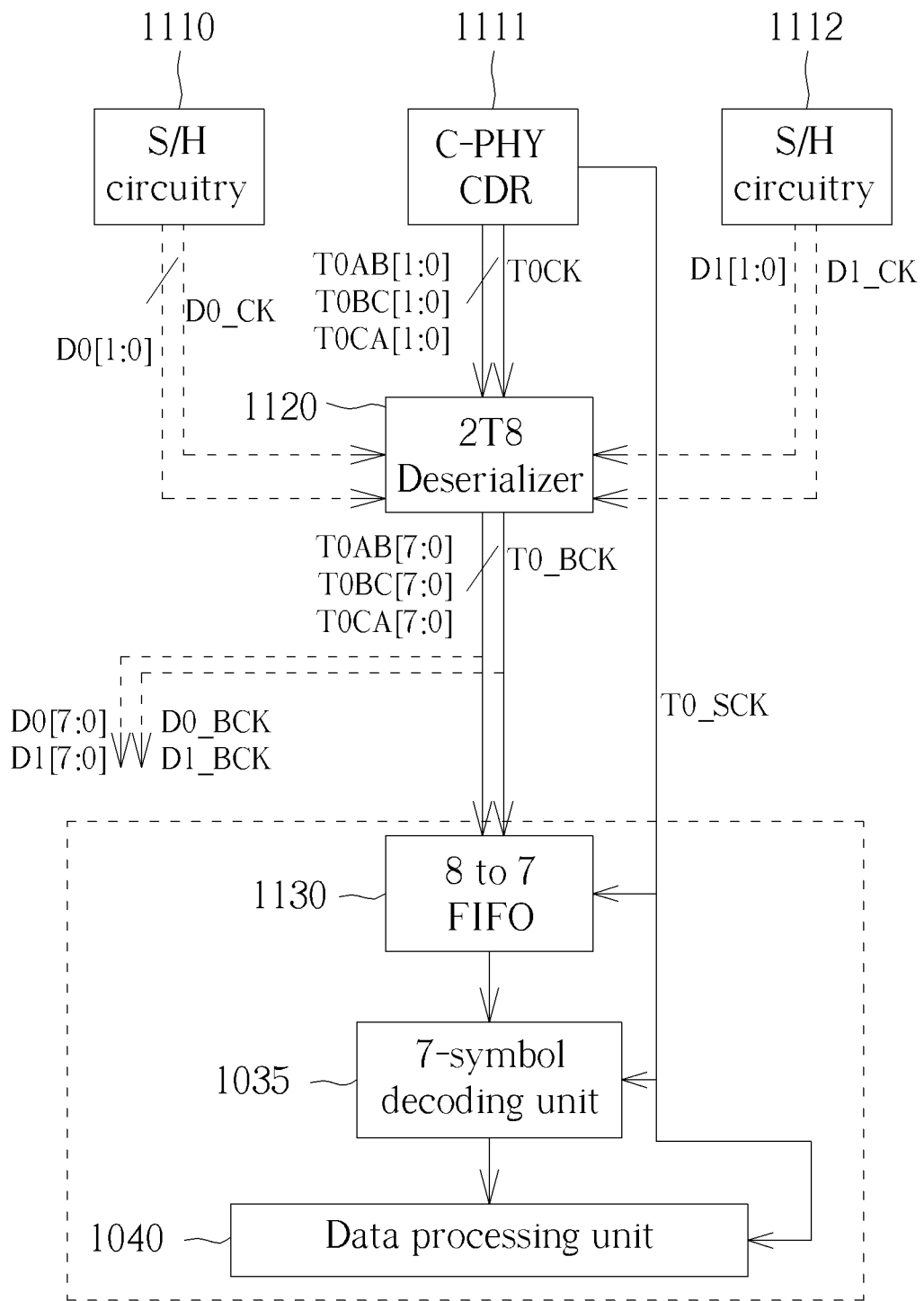
FIG. 2 illustrates how to reduce a number of the deserializer in a PMA according to one embodiment of the present invention.

As mentioned above, the 2-to-8 deserializers 931-933 may be merged for the sake of circuit area efficiency like the embodiment shown by FIG. 2, and the 2-to-8 deserializers 934 and 935 may be merged as well.

Figure 4:
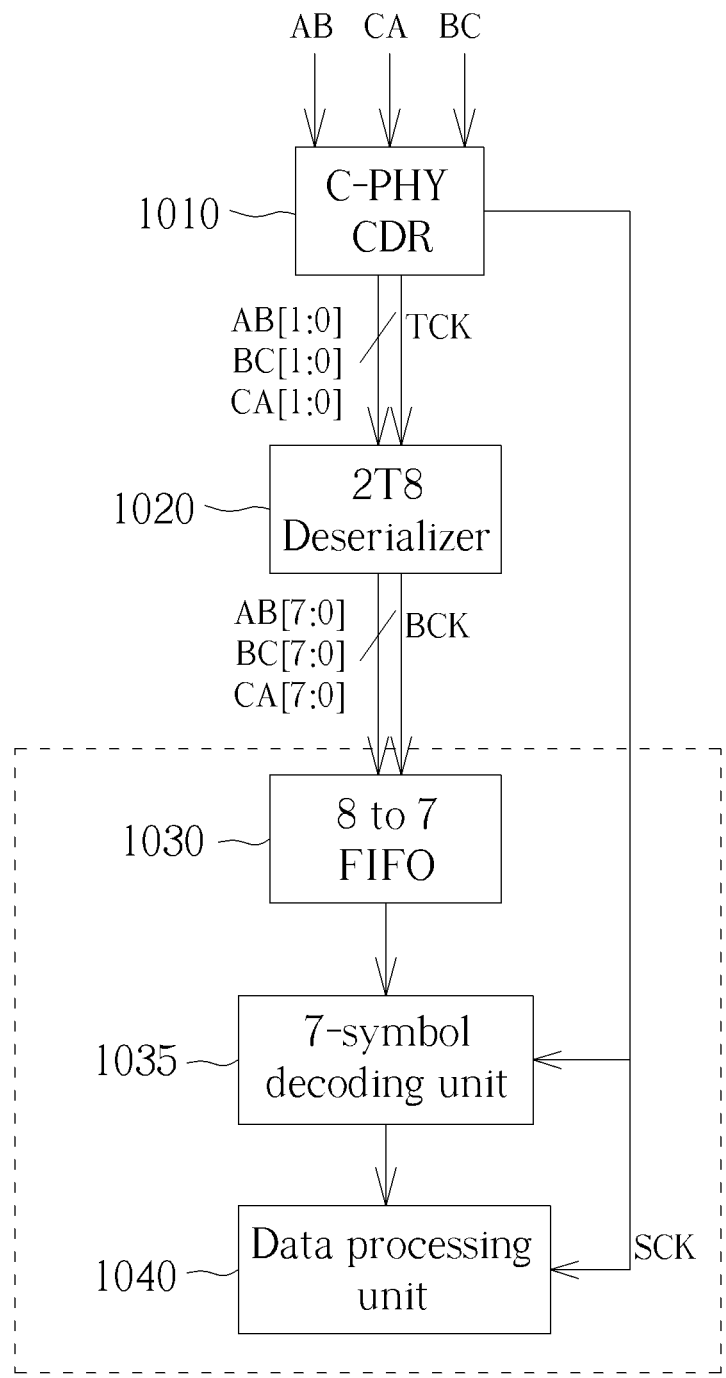
FIG. 4 illustrates how to process data signals at different stages with clock signals according to one embodiment of the present invention.

FIG. 4 illustrates how to process data signals at different stages with clock signals. The 2-to-8 deserializer 1020 de-serializes the data signals AB [1:0], BC [1:0] and CA [1:0] according to the clock signal TCK, wherein the frequency of the clock signal TCK is half a symbol rate of the communication link. The 8-to-7 FIFO 1030 converts the 8-bit data signals AB [7:0], BC [7:0], CA [7:0] into 7-bit long data word according to the clock signal BCK, wherein the frequency of the clock signal BCK is ⅛ of the symbol rate. The 7-symbol decoding unit 1035 is arranged to decode the data signal read from the 8-to-7 FIFO 1030 to generate symbols according to the clock signal SCK. A data processing unit 1040 is coupled to the 7-symbol decoding unit 1035 and arranged to process the symbols outputted therefrom. The data processing unit 1040 may comprise a 7-symbol to 16-bit demapper, which is arranged to de-map every 7 symbols received from 7-symbol decoding unit 1035 into a 16-bit data word according to the clock signal SCK, wherein the frequency of the clock signal SCK is ⅐ of the symbol rate.

Please note that any particular bit number of data width mentioned in the embodiments of FIG. 1 and FIG. 3 are intended for illustrative purposes rather than limitation of the present invention. One of ordinary skill in the art could understand how to choose different bit numbers of data width to configure the components, such as deserializers, FIFOs, symbol decoding units in the four-signal and six-signal PMAs according to different application and design requirements Pad Arrangement Signals transmitted from the PHY circuitry in FIG. 1 and FIG. 3 may suffer from interferences, such as cross-talk between signal transmission wires/lines. Hence, shielding techniques are applied to alleviate the interference in a variety of designs. To address such issues, inventive pad arrangements are applied in order to use and assign pads for shielding signal transmission from interferences more reasonably and efficiently.

Figure 5:
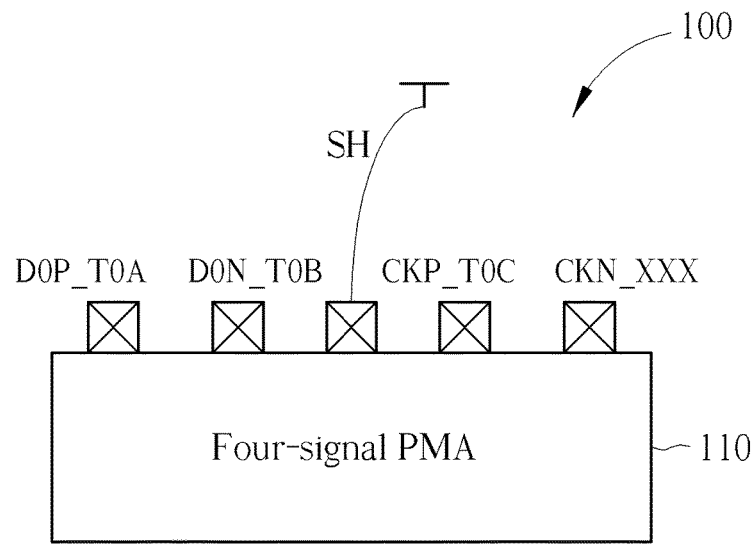
FIG. 5 illustrates a pad arrangement for a PHY including a four-signal PMA according to one embodiment of the present invention.

FIG. 5 illustrates a pad arrangement of a PHY including a four-signal PMA according to one embodiment of the present invention. As illustrated, the PHY 100 includes a four-signal PMA 110, and signal pads D0P_T0A, D0N_T0B, CKP_T0C and CKN_XXX for interfacing with other integrated circuits/devices, which are coupled to the four-signal PMA 110 through any possible types of conductors. A shielding pad SH is coupled to ground or a power supply voltage, and arranged to shield the signal pads D0P_T0A and D0N_T0B for preventing interference with the signal pads CKP_T0C and CKN_XXX.

The four-signal PMA 110 could be configured as either a two-wire lane PHY mode (e.g. MIPI D-PHY) or a three-wire lane PHY mode (e.g. MIPI C-PHY). In the two-wire lane PHY mode, the signal pads D0P_T0A and D0N_T0B may represent a data lane, while the signal pads CKP_T0C and CKN_XXX may represent a clock lane. The signal PMA 110 transmits/receives a pair of data signals through the signal pads D0P_T0A and D0N_T0B and transmits/receives a pair of clock signals through the signal pads CKP_T0C and CKN_XXX. In a three-wire lane mode, three pads represent a lane. For example, the signal pads D0P_T0A, D0N_T0B and CKP_T0C represent a lane, and the signal pad CKN_XXX may not be used.

Please note that the pad arrangement illustrated in FIG. 5 may be adaptable to a PHY including N signals pads and M shielding pads according various embodiments of the present invention, where N and M are positive integers. In such embodiment, the N signal pads includes at least four signal pads, while the M shielding pads includes at least one shielding pad. The at least four signal pads and the at least one shielding pads are arranged like the pad arrangement illustrated in FIG. 5.

Figure 6:
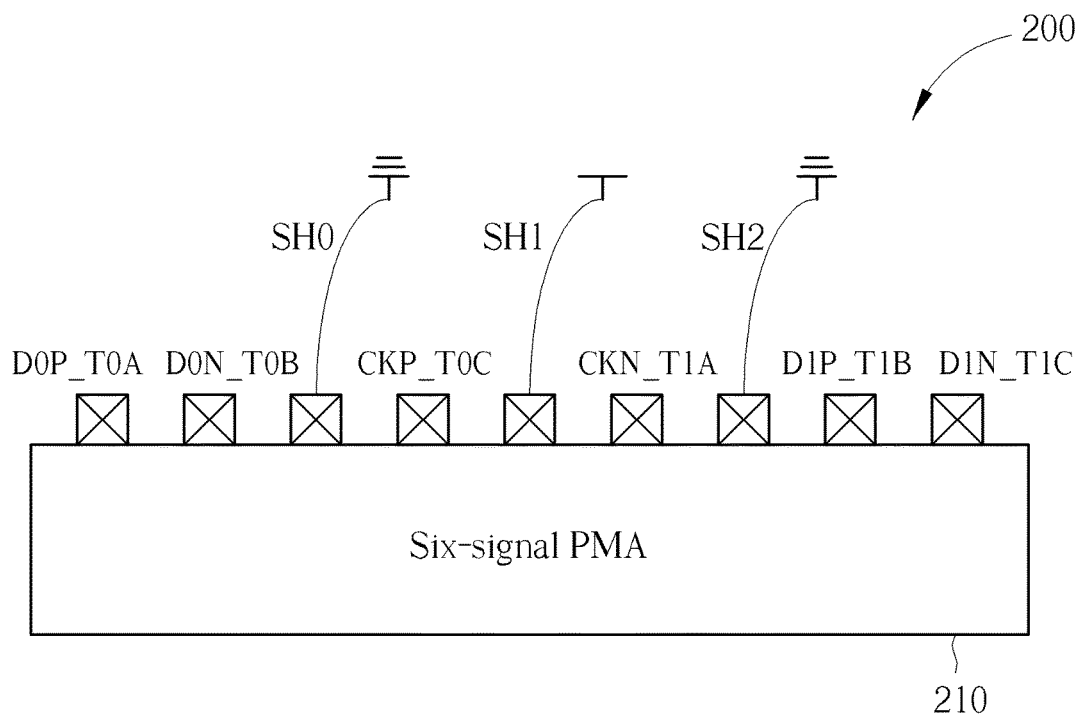
FIG. 6 illustrates a pad arrangement for a PHY including a six-signal PMA according to one embodiment of the present invention.

FIG. 6 illustrates a pad arrangement for a PHY including a six-signal PMA according to one embodiment of the present invention. As illustrated, the PHY 200 includes the six-signal PMA 210 and signal pads D0P_T0A, D0N_T0B, CKP_T0C, CKN_T1A, D1P_T1B and D1N_T1C for interfacing with another integrated circuit/device. Shielding pads SH0, SH1 and SH2 are coupled to ground or a power supply voltage, and arranged to shield certain signal pads from interference signals caused by other signal pads.

The six-signal PMA 210 could be configured as either a two-wire lane PHY mode or a three-wire lane PHY mode. In the two-wire lane PHY mode, the signal pads D0P_T0A and D0N_T0B may represent a data lane, while the signal pads CKP_T0C and CKN_XXX may represent a clock lane. The six-signal PMA 210 transmits/receives pairs of data signals through the signal pads D0P_T0A and D0N_T0B and D1P_T1B and D1N_T1C and transmits/receives a pair of clock signals through the signal pads CKP_T0C, CKN_T1A. In a three-wire lane PHY mode, three pads represent a lane. For example, the signal pads D0P_T0A, D0N_T0B and CKP_T0C represent a three-wire lane, while the signal pads CKN_T1A, D1P_T0B and D1N_T1C represent another three-wire lane.

Please note that the pad arrangement illustrated in FIG. 6 may be adaptable to a PHY including N signals pads and M shielding pads according various embodiments of the present invention, where N and M are positive integers. In such embodiment, the N signal pads includes at least six signal pads, while the M shielding pads includes at least three shielding pad. The at least six signal pads and the at least three shielding pads are arranged like the pad arrangement illustrated in FIG. 6.

Figure 7:
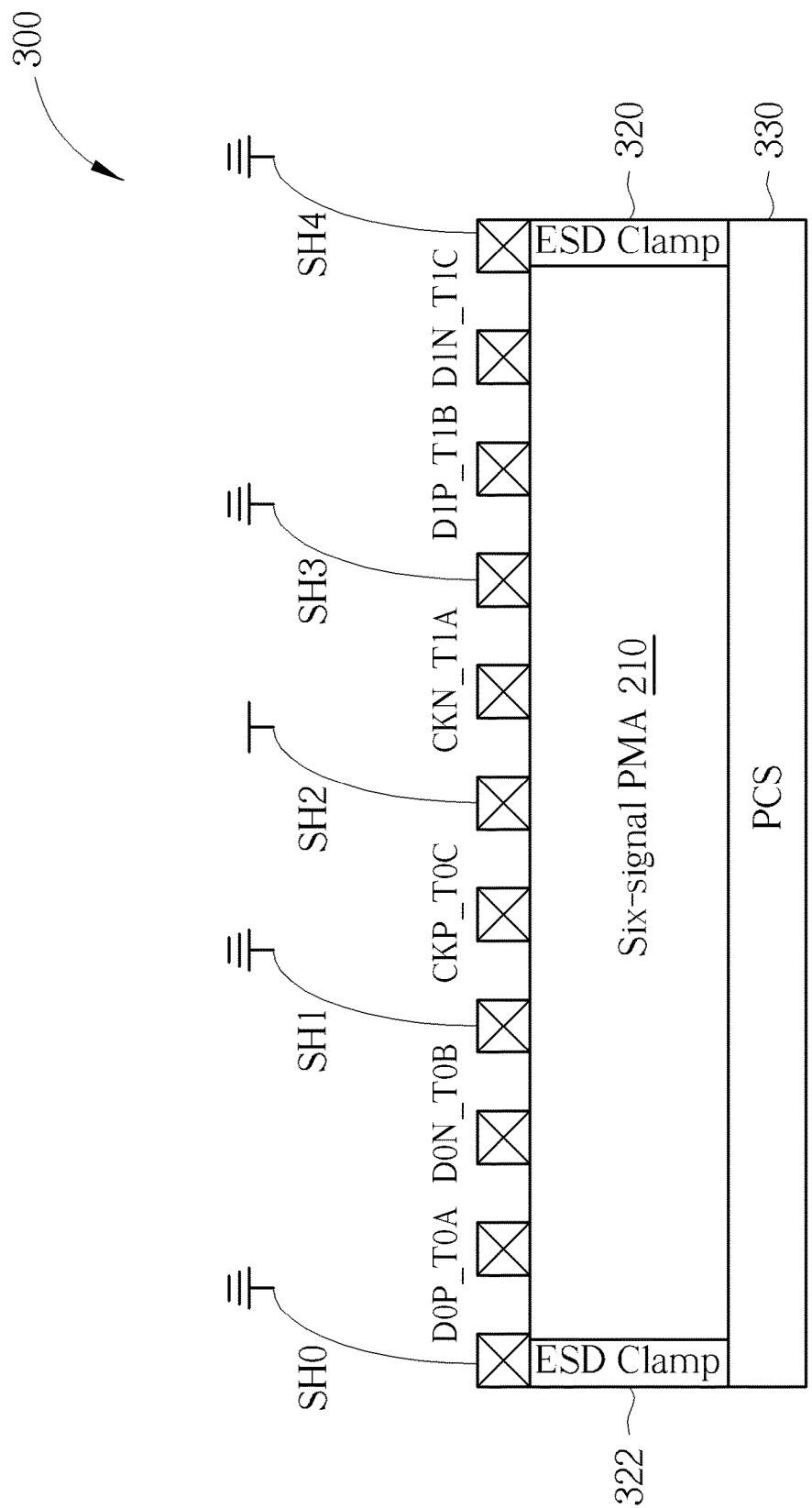
FIG. 7 and FIG. 8 illustrate pad arrangements regarding both electrostatic discharge (ESD) protection and pad shielding.
Figure 8:
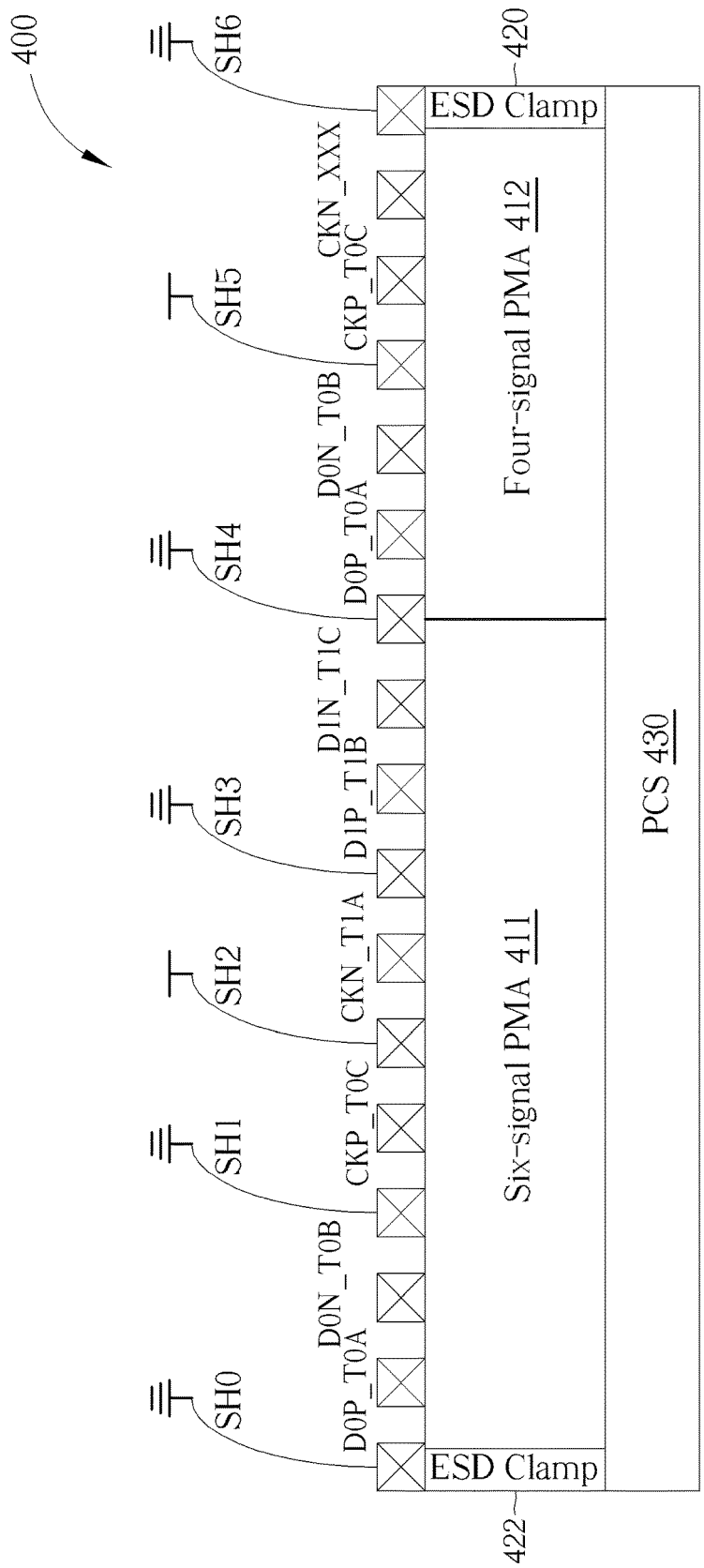

FIG. 7 and FIG. 8 illustrate pad arrangements regarding both electrostatic discharge (ESD) protection and pad shielding. FIG. 7 illustrates a pad arrangement for a PHY including a six-signal PMA according to one embodiment of the present invention. As illustrated, the PHY 300 includes six-signal PMA 210, a physical coding sublayer (PCS) 330, ESD protection circuits 320 and 322 and signals pads D0P_T0A, D0N_T0B, CKP_T0C, CKN_T1A, D1P_T1B and D1N_T1C for interfacing with another integrated circuit/device. Shielding pads SH0 and SH4 are arranged to couple the ESD protection circuits 320 and 322 to ground and intended for providing electromagnetic shielding from ESD. Additionally, shielding pads SH1, SH2 and SH3 are coupled to ground or power supply voltage, and arranged to shield certain signal pads from interference signals from other signal pads.

FIG. 8 illustrates pad arrangement for an integrated circuit including a combination of a six-signal PMA and a four-signal PMA according to one embodiment of the present invention. As illustrated, the PHY 400 includes the six-signal PMA 411, the four-signal PMA 412, a PCS 430, ESD protection circuits 420 and 422. The six-signal PMA 411 relies upon signal pads D0P_T0A, D0N_T0B, CKP_T0C, CKN_T1A, D1P_T1B, and D1N_T1C for interfacing with another integrated circuit/device. The four-signal PMA 412 relies upon signal pads D0P_T0A, D0N_T0B, CKP_T0C and CKN_XXX for interfacing with another integrated circuit/device. Shielding pads SH0 and SH6 are arranged to couple the ESD protection circuits 420 and 422 to ground and intended for providing electromagnetic shielding from ESD. Additionally, shielding pads SH1, SH2, SH3, SH4 and SH5 are coupled to ground or power supply voltage, and arranged to shield certain signal pads from interference signals from other signal pads.

Termination

As mentioned above, both the four-signal PMA and six-signal PMA can be configured as and operated in a two-wire lane PHY mode or a three-wire lane PHY mode. Therefore, there is a need to provide a termination circuit that is adaptable to signaling characteristics of these different PHY modes.

Figure 9A:
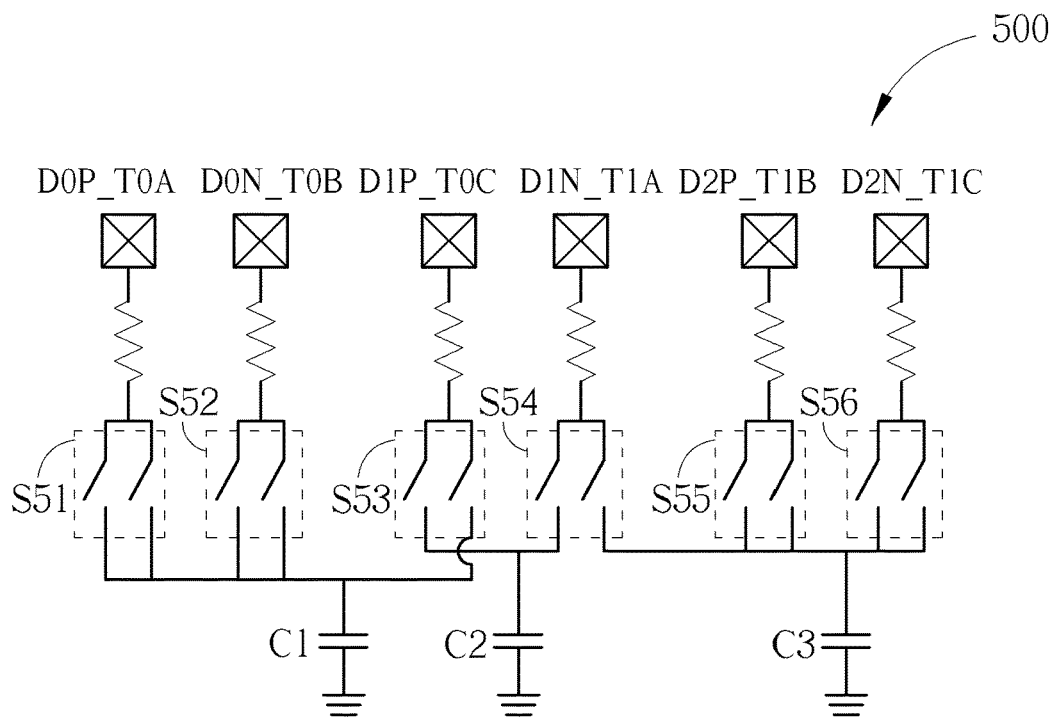
FIGS. 9A-9C illustrate a termination circuit that is adaptable to both the two-wire lane PHY mode and the three-wire lane PHY mode according to the related art.
Figure 9B:
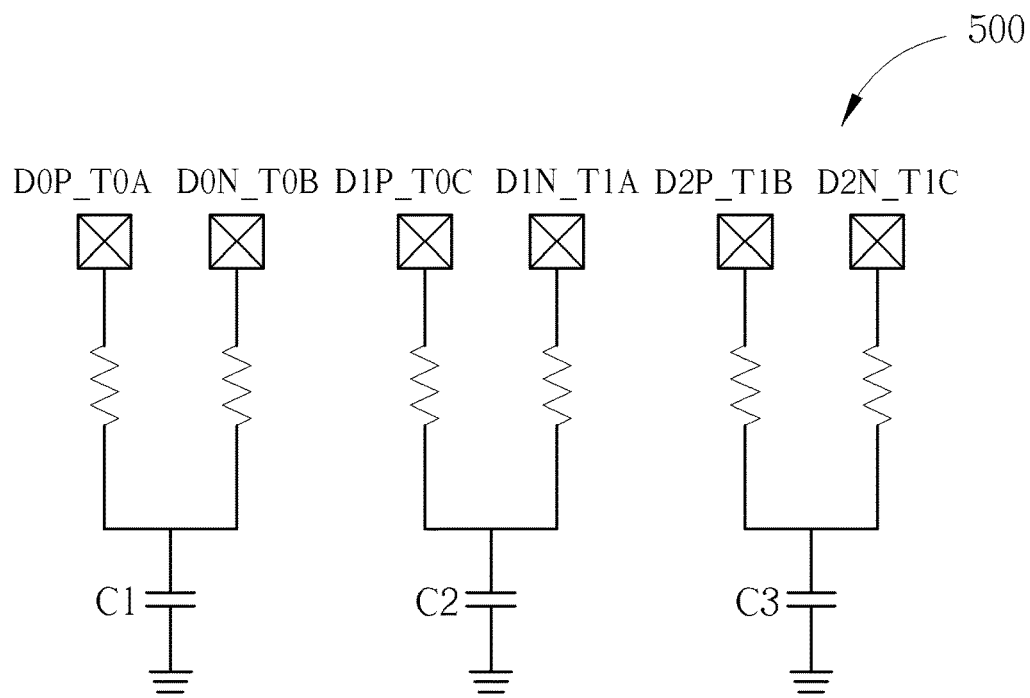
Figure 9C:
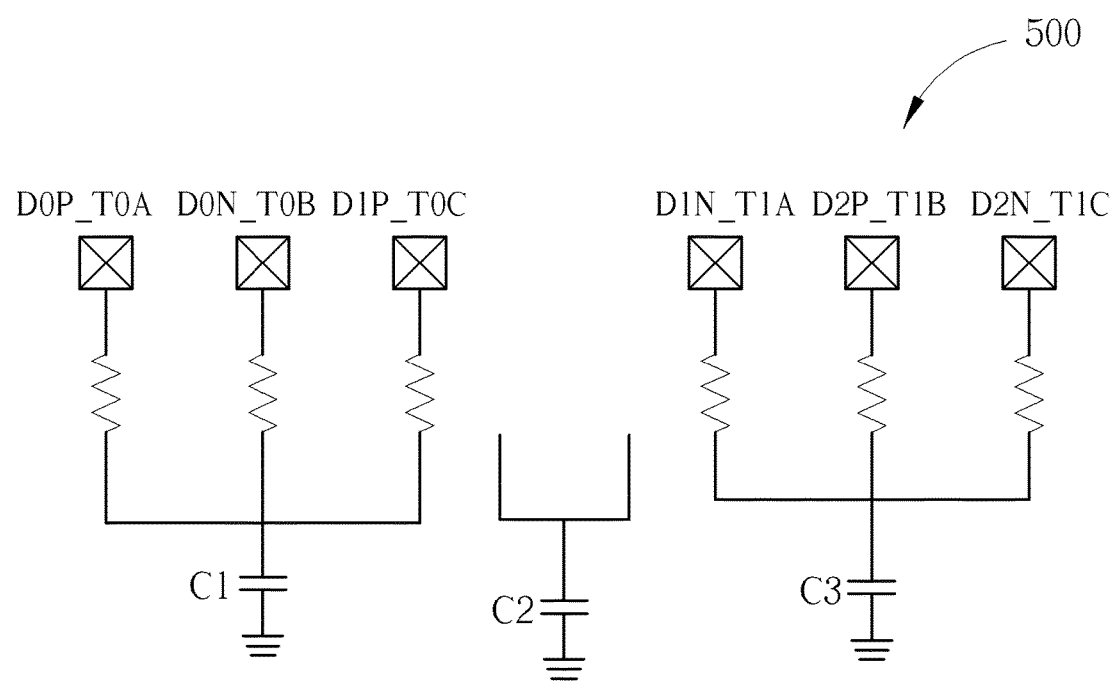

FIG. 9A illustrates a termination circuit that is adaptable to both the two-wire lane PHY mode and the three-wire lane PHY mode according to the related art. By controlling switches in the termination circuit 500 of FIG. 9A, the termination circuit 500 could switch to a first configuration for adapting to two-wire lane illustrated FIG. 9B or switch to a second configuration for adapting to three-wire lane illustrated FIG. 9C. In the MIPI standard, it is required to have an equivalent decoupling capacitance in a three-wire lane larger than an equivalent decoupling capacitance in A two-wire lane. Hence, a capacitance of each decoupling capacitive elements C1, C2 and C3 will be 1x (where "x" represents a unit capacitance). However, such implementation causes capacitance redundancy (i.e., capacitive element C2) in the three-wire lane configuration (as illustrated by FIG. 9C).

In order to overcome the capacitance redundancy of the termination circuit 500 in the three-wire lane configuration, the present invention provides an innovative architecture for improve the termination circuit.

Figure 10A:
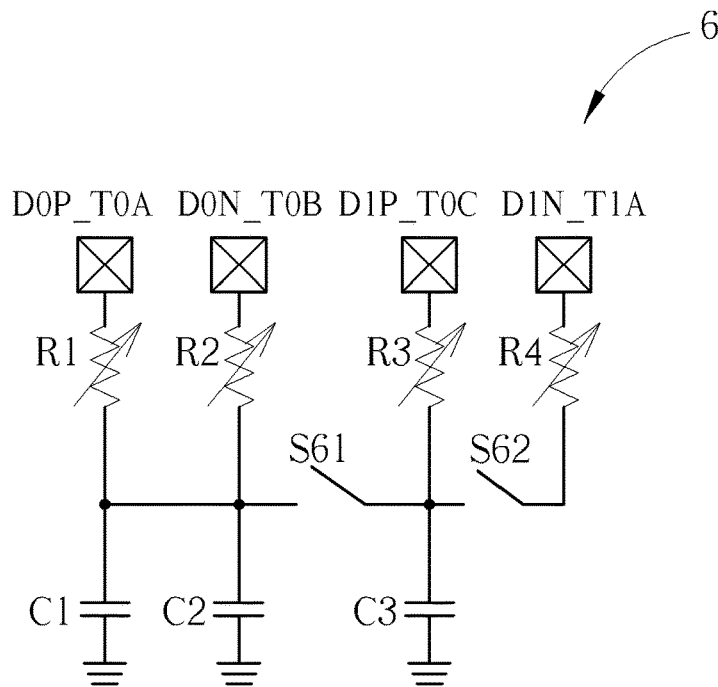
FIGS. 10A-10D illustrate termination circuits for a four-signal PMA according to embodiments of the present invention.

FIG. 10A illustrates a four-signal termination circuit 600 for a PHY circuitry including a four-signal PMA according to one embodiment of the present invention. The termination circuit 600 includes adjustable resistive elements R1-R4, switches S61-S62 and decoupling capacitive elements C1-C3 (each of the capacitive elements C1-C2 has a capacitance of 0.5x while the capacitive element C3 has a capacitance of 1x). In this embodiment, each of the adjustable resistive elements R1-R4 could be could be coupled to one of pads of PHY circuitry including a four-signal PMA, such as the four-signal PMA 800. Please note that the adjustable resistive elements R1-R4 may be replaced by another other types of electrical impedance elements according to various embodiments of the present invention.

Figure 10B:
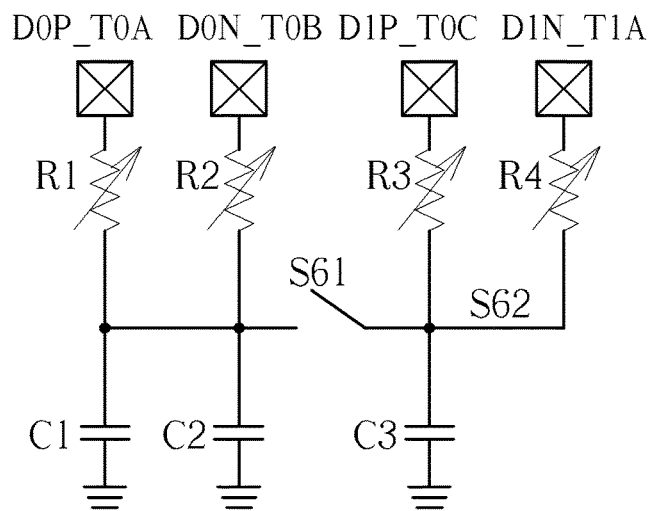
Figure 10C:
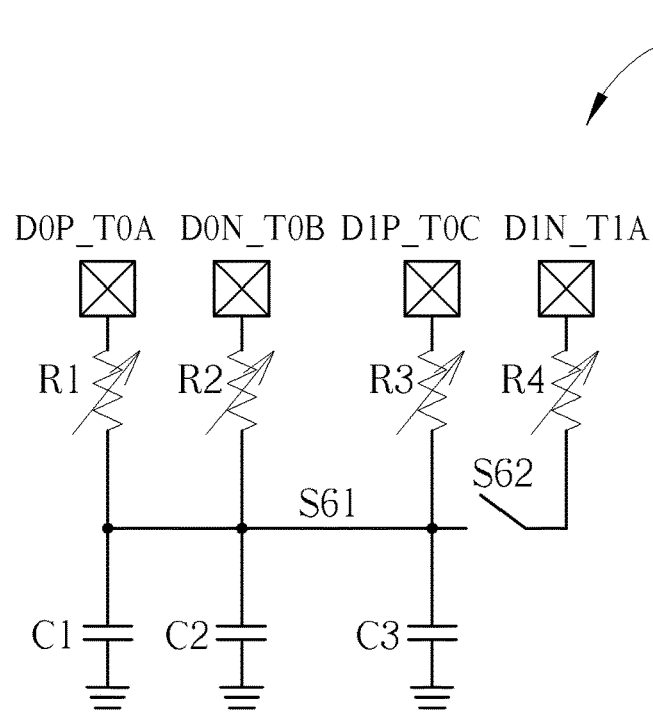
Figure 10D:
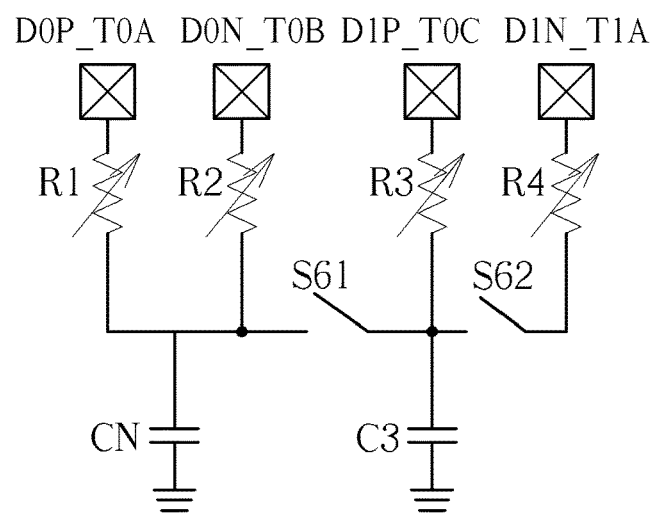

Please refer to FIG. 10A in conjunction with FIG. 1. When the four-signal PMA 800 is configured as and operated in the two-wire lane PHY mode, every two pads will form a lane. A pair of data signals may be transmitted/received respectively through pads D0P_T0A and D0N_T0B, while another pair of clock signals are transmitted/received respectively through the pads D1P_T0C and D1N. At this time, the switch S62 is conducted while the switch S61 is not conducted (illustrated in FIG. 10B). As such, there is an equivalent decoupling capacitance of (0.5+0.5)x obtained at the pads D0P_T0A and D0N_T0B, and a decoupling capacitance of 1x obtained at the pads D1P_T0C and D1N, respectively. Furthermore, when the four-signal PMA 800 is configured as and operated in the three-wire lane PHY mode, the switch S61 is conducted while the switch S62 is not conducted (illustrated in FIG. 10C). As such, there is an equivalent decoupling capacitance of (0.5+0.5+1) x obtained at the pads D0P_T0A, D0N_T0B and D1P_T0C. Furthermore, as shown by FIG. 10D, the decoupling capacitive elements C1 and C2 could be combined and implemented with a larger decoupling capacitive element CN having a capacitance of (0.5+0.5)x in an alternative embodiment.

Figure 11A:
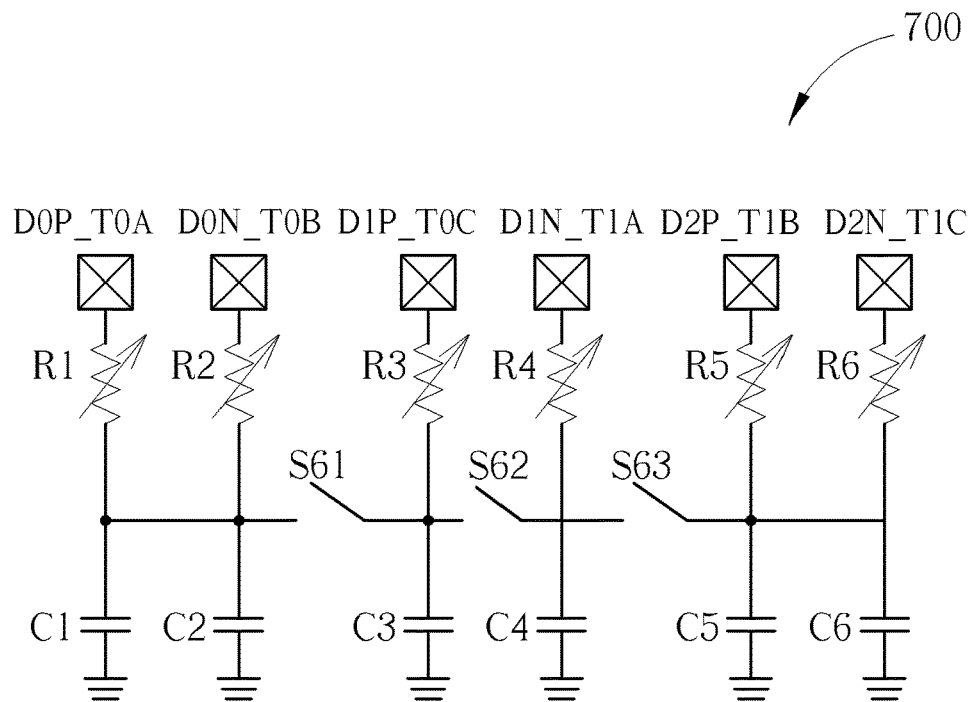
FIGS. 11A-11D illustrate termination circuits for a six-signal PMA according to embodiments of the present invention.

FIG. 11A illustrates a diagram of a six-signal termination circuit 700 for a PHY circuitry including a six-signal PMA according to one embodiment of the present invention. The six-signal termination circuit 700 includes adjustable resistive elements R1-R6, switches S61-S63 and decoupling capacitive elements C1-C6 (; each of which has a capacitance of 0.5x). In this embodiment, each of the adjustable resistive elements R1-R6 could be coupled to one of pads of the PHY circuitry including the six-signal PMA, such as the six-signal PMA 900. Please note that the adjustable resistive elements R1-R6 may be replaced by another other types of electrical impedance elements according to various embodiments of the present invention.

Please refer to FIG. 11A in conjunction with FIG. 3. When the six-signal PMA 900 is configured as and operated in the two-wire lane PHY mode, a pair of data signals may be transmitted respectively on pads D0P_T0A and D0N_T0B, a pair of data signals are transmitted respectively on pads D1P_T0C and D1N_T1A while a pair of clock signals are transmitted respectively on pads D2P_T1B and D2N_T1C. Alternatively, when the six-signal PMA 900 is configured as and operated in a three-wire lane PHY mode, the six-signal PMA 900 could be provided with two three-wire lanes. For example, a set of three signals are transmitted respectively on pads D0P_T0A, D0N_T0B and signal pads D1P_T0A and another set of three signals are transmitted respectively on pads D1N_T1A, D2P_T1B and D2P_T1C.

Figure 11B:
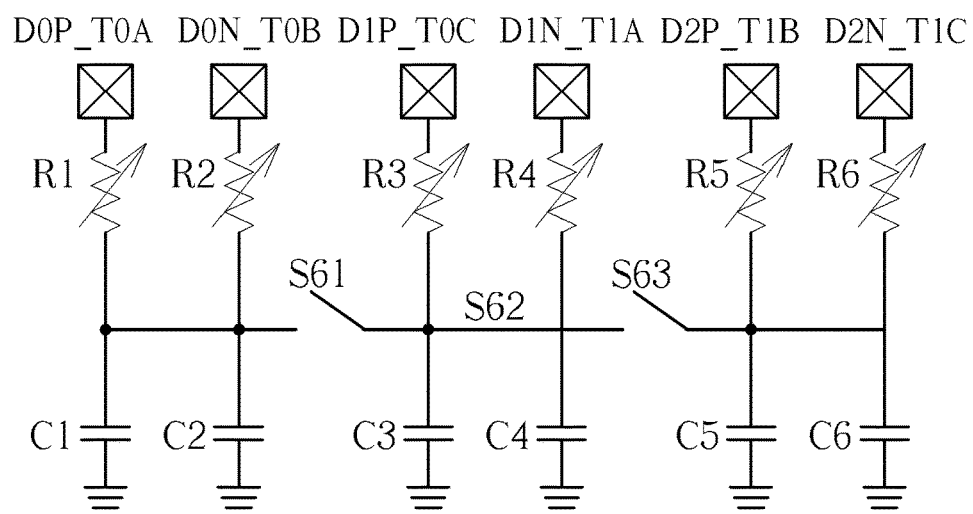
Figure 11C:
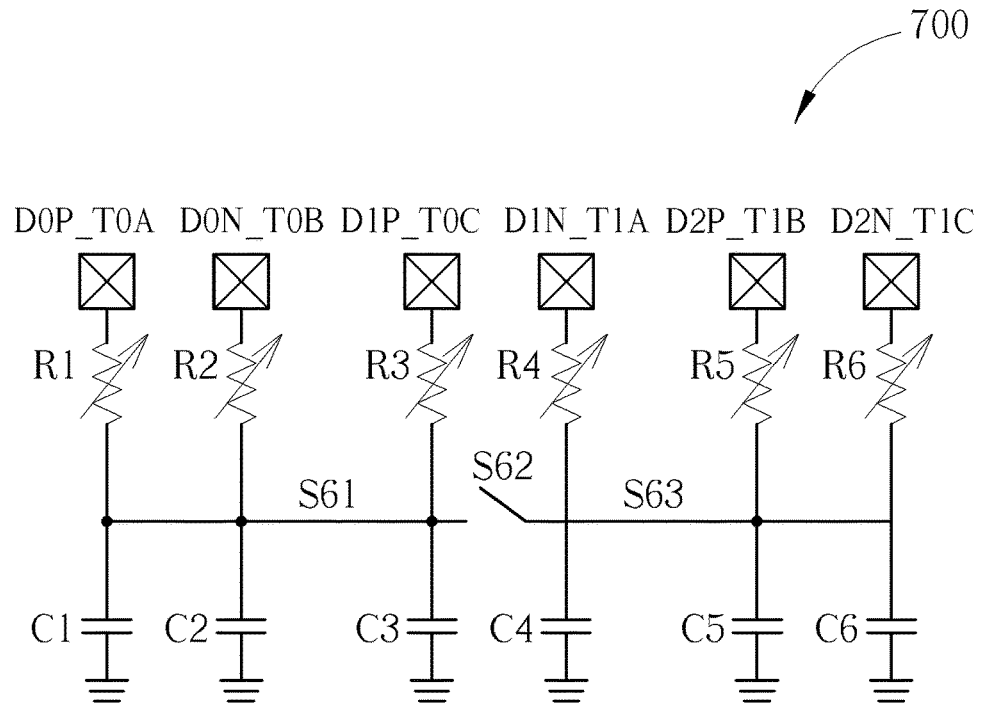
Figure 11D:
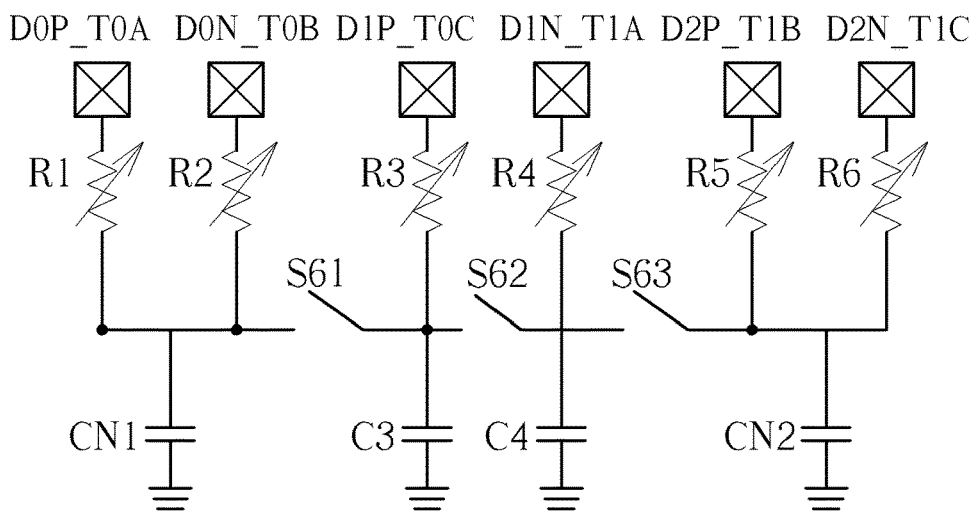

When the six-signal PMA 900 is configured as and operated in the two-wire lane PHY mode, the switch S62 is conducted while the switches S61, S63 are not conducted (illustrated in FIG. 11B). As such, there is an equivalent decoupling capacitance of (0.5+0.5)x formed at the pads D0P_T0A and D0N_T0B, the pads D1P_T0C and D1N_T1A, and pads the D2P_T1B and D2N_T1C, respectively. Furthermore, when the six-signal PMA 900 is configured as and operated in the three-wire lane PHY mode, the switches S61 and 63 are conducted while the switch S62 is not conducted (illustrated in FIG. 11C). As such, there is an equivalent decoupling capacitance of (0.5+0.5+0.5)x formed at the pads D0P_T0A, D0N_T0B and D1P_T0C, as well as at pads D1N_T1A, D2P_T1B and D2N_T1C, respectively. Furthermore, as shown by FIG. 11D, the decoupling capacitive elements C1 and C2 could be combined and implemented with a larger decoupling capacitive element CN1 having a capacitance of (0.5+0.5)x in an alternative embodiment. Additionally, the decoupling capacitive elements C5 and C6 could be also combined and implemented with a larger decoupling capacitive element CN2 having a capacitance of (0.5+0.5)x in the alternative embodiment.

Compared to the termination circuit 500, there is no capacitance redundancy in the four-signal termination circuit 600 and the six-signal termination circuit 700 when switched to the three-wire lane configuration. Another advantage of the termination circuits 600 and 700 of the present invention is the number of switches. As the switches required by the termination circuits 600 and 700 are fewer compared to the termination circuit 500, the signal loss can be reduced.

Clock and Data Recovery

In the MIPI C-PHY standard, the clock signal is embedded into the data signals. Hence, the physical layer unit in a receiver needs to recover a clock signal from the received data signals.

Figure 12:
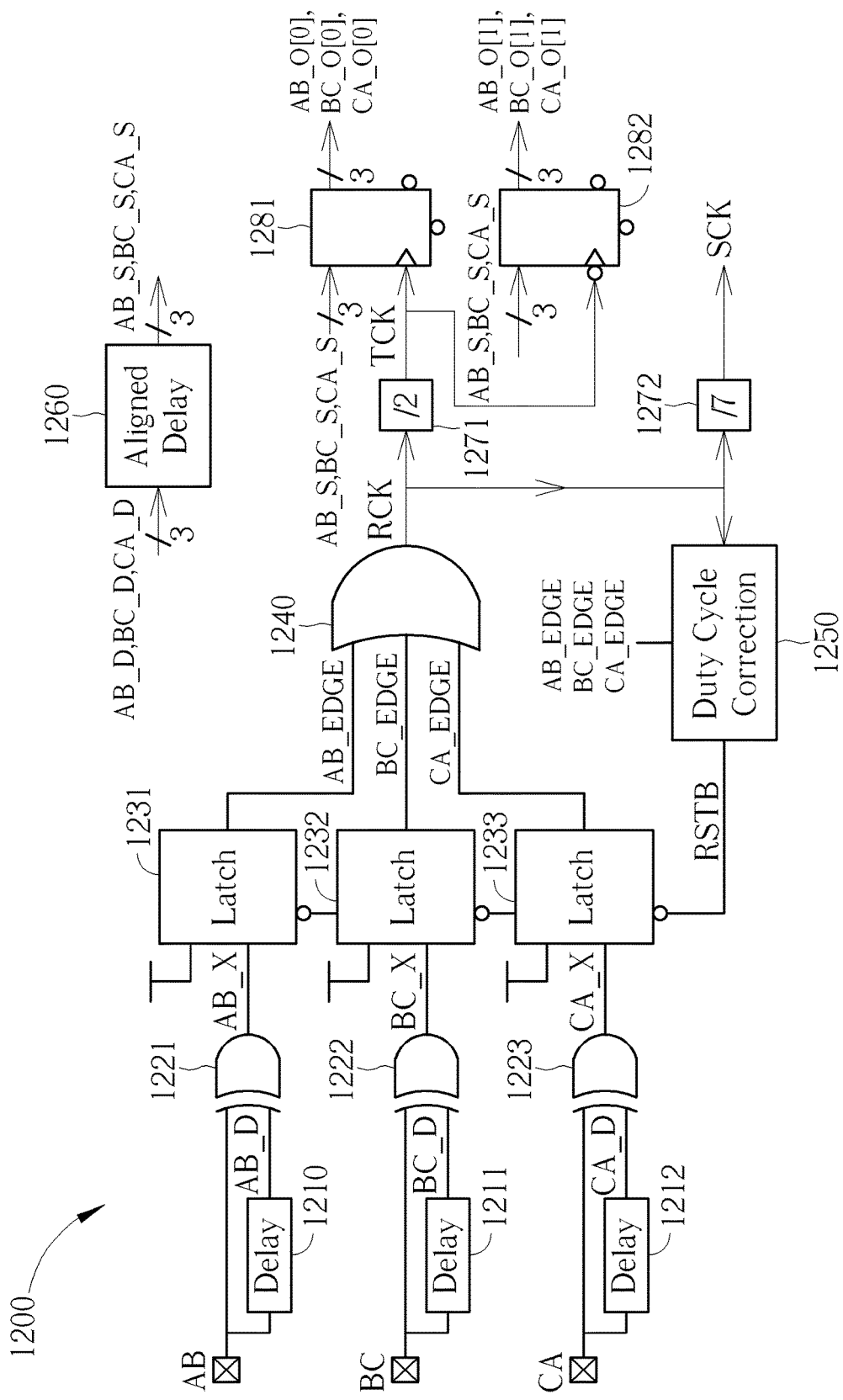
FIG. 12 illustrates a CDR circuit in a receiver of a three-wire communication link according to one embodiment of the present invention.

According to one embodiment of the present invention, a CDR circuit in a receiver for a MIPI C-PHY (or other three-wire lane PHY standard) communication link is illustrated in FIG. 12. As illustrated, CDR circuit 1200 has three input terminals for receiving signals AB, BC, and CA that are generated by differential amplifiers. The above-mentioned differential amplifiers may be the differential amplifiers 811-813 shown in the embodiment of FIG. 1 or the differential amplifiers 911-916 shown in the embodiment of FIG. 3, which receives differential signals on three pads/wires of a trio, i.e., pads D0P_T0A, D0N_T0B, D1P_T0C and convert them to differential signals AB, BC, CA (i.e., T0AB [1:0], T0BC [1:0], T0CA [1:0] in FIG. 1 or FIG. 3)

The three signals AB, BC, and CA are inputted to delay units 1210, 1211 and 1212, thereby to generate delayed versions AB_D, BC_D, and CA_D of the signals AB, BC, and CA. Then, XOR gates 1221, 1222 and 1223 perform XOR operations on signals AB and AB_D, BC and BC_D and CA and CA_D, respectively. Accordingly, the XOR gates 1221, 1222 and 1223 generate XOR output signals AB_X, BC_X and CA_X. Due to XOR operation, transitions in the signals AB, BC and CA will introduce pulses in XOR output signals AB_X, BC_X and CA_X. The XOR output signals AB_X, BC_X and CA_X are then sent to latches 1231, 1232 and 1233, and used to clock the latches 1231, 1232 and 1233 to latch a high logic level signal. In addition, the latches 1231, 1232 and 1233 are resettable by a reset control signal RSTB. Therefore, rising edges of latch output signals AB_EDGE, BC_EDGE and CA_EDGE are respectively triggered by the XOR output signals AB_X, BC_X and CA_X, while falling edges of latch output signals AB_EDGE, BC_EDGE and CA_EDGE are respectively triggered by the reset control signal RSTB.

Then, the latch output signals AB_EDGE, BC_EDGE and CA_EDGE are sent to an OR gate 1240, which performs OR operations on the latch output signals AB_EDGE, BC_EDGE and CA_EDGE, thereby to produce a clock signal RCK. The clock signal RCK may be processed by a frequency dividers 1271 and 1272 with different divisors (i.e., 2 and 7) for producing clock signals for different purposes. A clock signal TCK generated by the frequency divider 1271 will be provided to sampling units 1281 and 1282 for sampling signals AB_S, BC_S and CA_S in order for performing deserialization (where the signals AB_S, BC_S and CA_S may be derived by delaying the signals AB_D, BC_D and CA_D through an aligned delay unit 1260). Further, the clock signal SCK generated by the frequency divider 1272 will be provided to units, such as the data processing unit 850 (in FIG. 1), 951-952 (in FIGS. 3) and 1040 (in FIG. 4) for performing data processing operations.

On the other hand, the produced clock signal RCK is further sent to a duty cycle correction circuit 1250 thereby to generate a reset control signal RSTB. The duty cycle correction circuit 1250 is intended for correcting the clock signal RCK, so as to achieve 50% duty cycle for the clock signal RCK (or around 50%) The duty cycle correction circuit 1250 corrects the duty cycle of the clock signal RCK by generating the reset control signal RSTB to achieve 50% duty cycle.

As mentioned above, the clock signal RCK is generated by performing OR operation on the latch output signals AB_EDGE, BC_EDGE and CA_EDGE. Hence, adjusting the duty cycle of the latch output signals AB_EDGE, BC_EDGE and CA_EDGE (by resetting these signals) can substantially change the duty cycle of the clock signal RCK.

Figure 13:
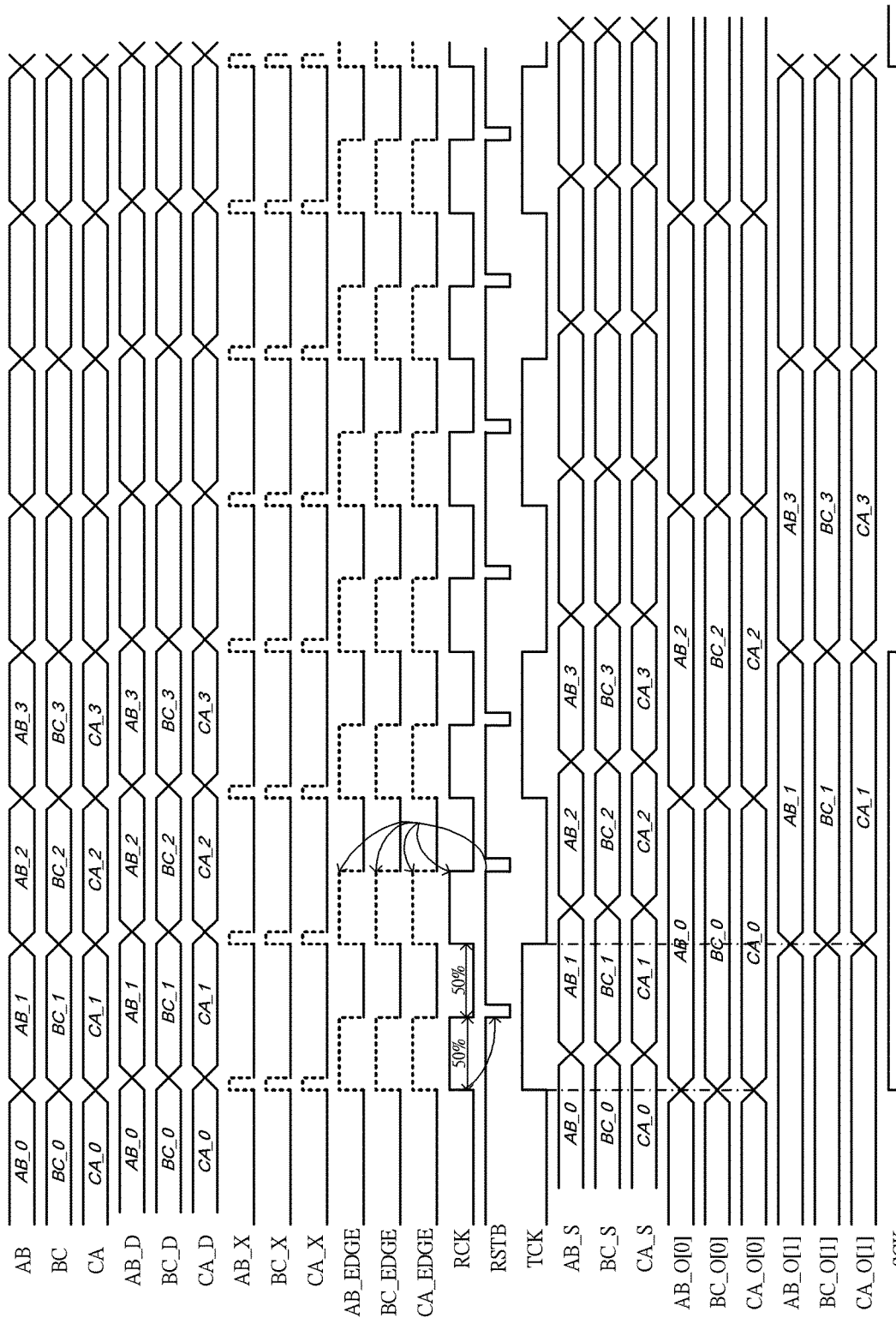
FIG. 13 illustrates a timing diagram regarding the CDR circuit with the duty cycle correction circuit.

A timing diagram showing the clock signal RCK is processed with the duty cycle correction circuit 1250 is illustrated in FIG. 13. As pulses of the signals AB_X, BC_X and CA_X tracks transitions of signals AB, BC, and CA, the pulses of the signals AB_X, BC_X and CA_X are designated with dashed lines to reflect such condition. The pulses of the signals AB_X, BC_X and CA_X will trigger the latches 1231, 1232 and 1233 to have the latch output signals AB_EDGE, BC_EDGE and CA_EDGE to transition to the high logic level. Also, when the reset control signal RSTB is asserted, the latches 1231, 1232 and 1233 are reset, which cause the latch output signals AB_EDGE, BC_EDGE and CA_EDGE to transition to the low logic levels. It can be appreciated that the timing of the pulses of the reset control signal RSTB can determine the duty cycles of the latch output signals AB_EDGE, BC_EDGE and CA_EDGE and therefore the duty cycle of the clock signal RCK.

Figure 14:
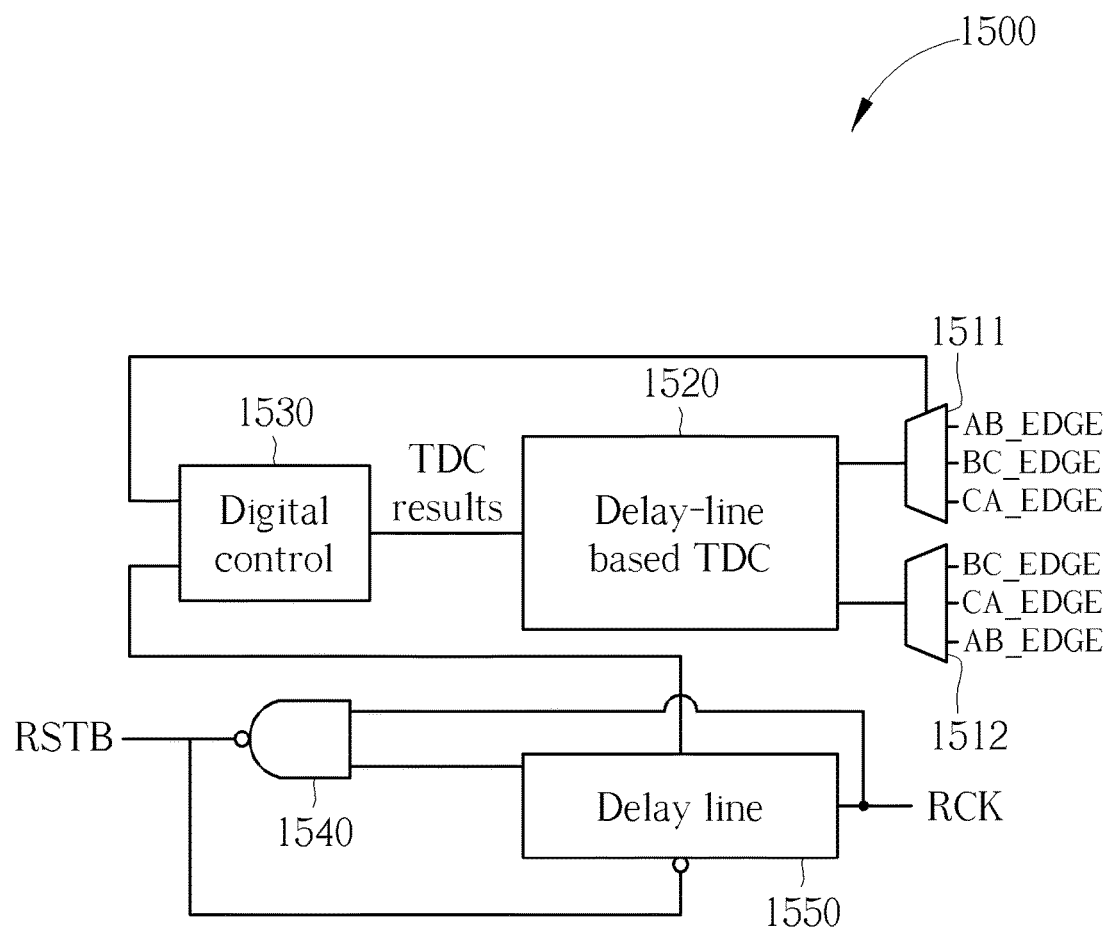
FIG. 14 illustrates a detailed circuit diagram of the duty cycle correction circuit according to one embodiment of the present invention.

According to various embodiments of the present invention, the duty cycle correction circuit may have different circuitry. Please refer to FIG. 14, which illustrates a detailed circuit diagram of an embodiment of the duty cycle correction circuit 1250. As illustrated, the duty cycle correction circuit 1500 has a time to digital converter 1520. The time to digital converter 1520 is configured to measure time differences between adjacent edges of the signals AB_EDGE, BC_EDGE and CA_EDGE and accordingly to converts the measured time differences into digital (TDC) results. Selectors 1511 and 1512 are configured to select two signals out of the signals AB_EDGE, BC_EDGE and CA_EDGE to be measured by time to digital converter 1520. The TDC results are averaged by the digital control circuit logic 1530 and the digital control logic 1530 outputs a delay control signal to control a delay line 1550 according to half of the averaged result. The delay line 1550 is configured to delay the clock signal RCK. An NAND gate 1540 is configured to perform an NAND operation on the clock signal RCK and a delayed version of the clock signal RCK, thereby to produce the reset control signal RSTB. When the time differences between the signals AB_EDGE, BC_EDGE and CA_EDGE are longer, the duty cycle of the clock signal RCK will be longer, and vice versa. Hence, when the TDC results will reflect such condition, thereby to make the digital control logic 1530 to find proper delay of the delay line, thereby adjusting the timing of the reset control signal RSTB to so as to achieve make the clock signal RCK have the duty cycle around 50%. Please note that the NAND gate 1540 may be replaced by another other types of logic gates or a combination of logic gates as long as they can provide same results.

Figure 15:
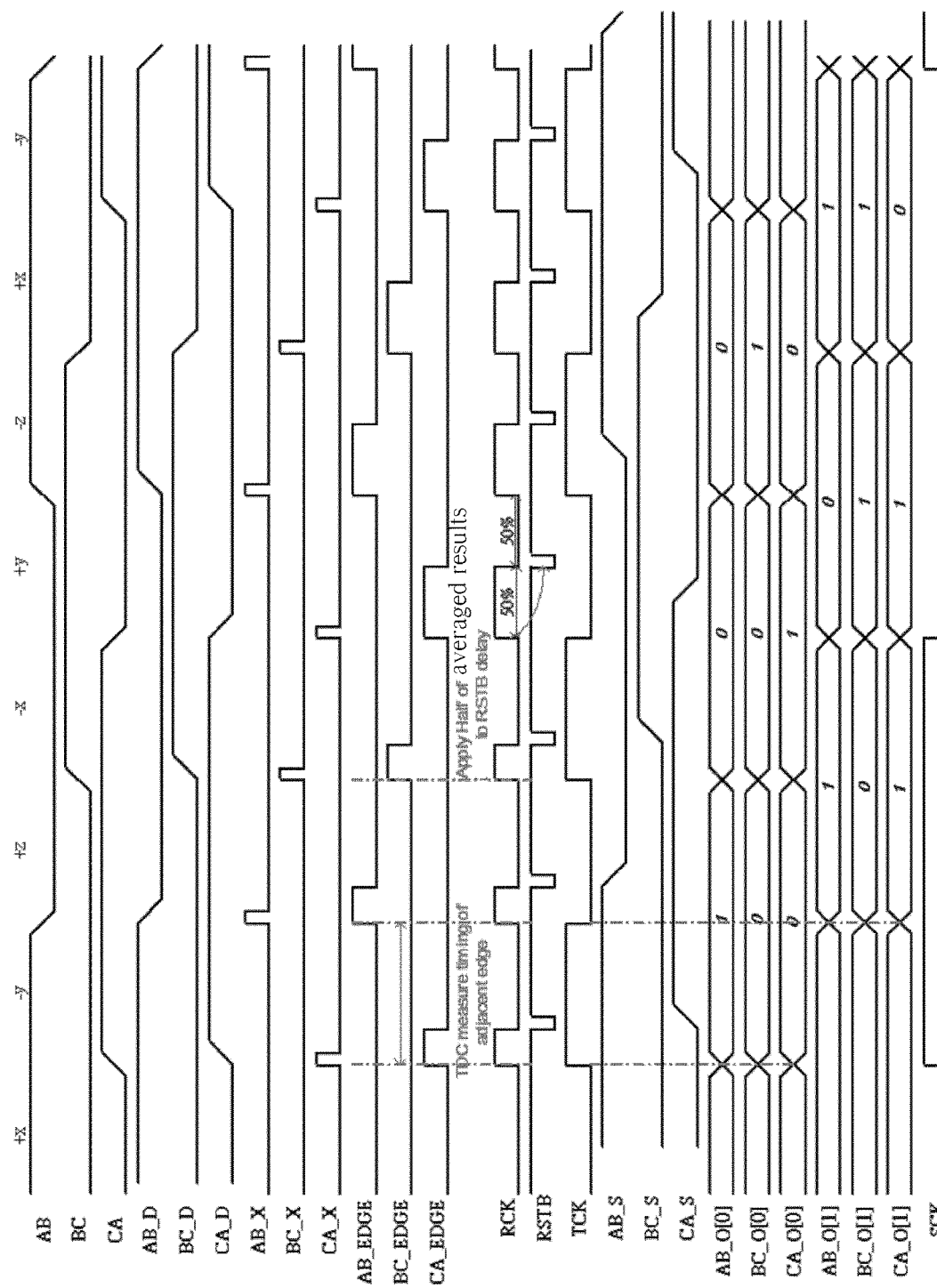
FIG. 15 and FIG. 16 are timing diagrams for explaining on how the duty cycle correction circuit of FIG. 14 works.
Figure 16:
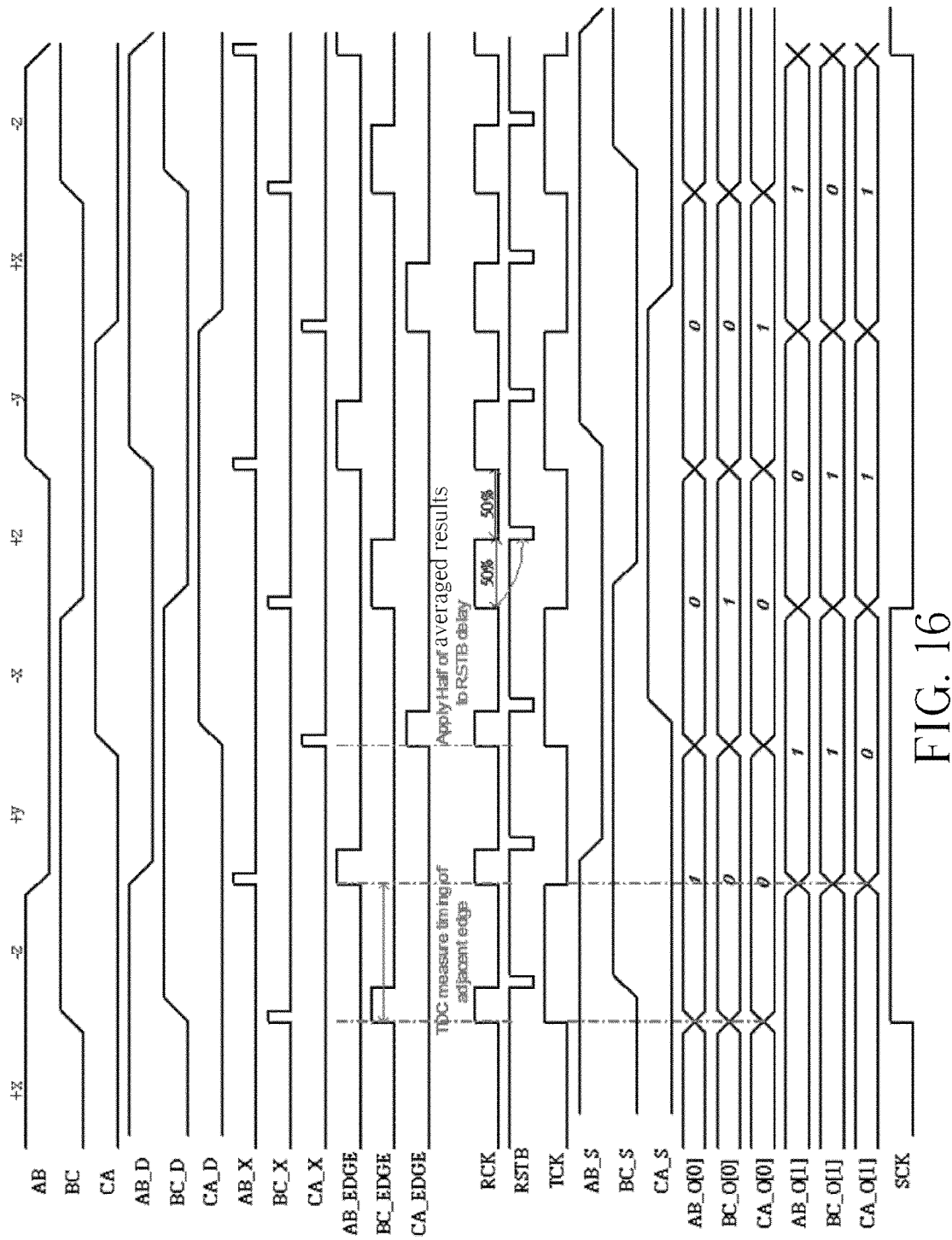

Please refer to FIG. 15 and FIG. 16 for better understandings on how the duty cycle correction circuit 1500 actually works in processing a repeat input pattern "+x→−y→+z→−x→+y→−z→+x" representing symbols 3333333 and a repeat input pattern +x→−z→+y→−x→+z→−y→+x representing symbols 1111111.

Figure 17:
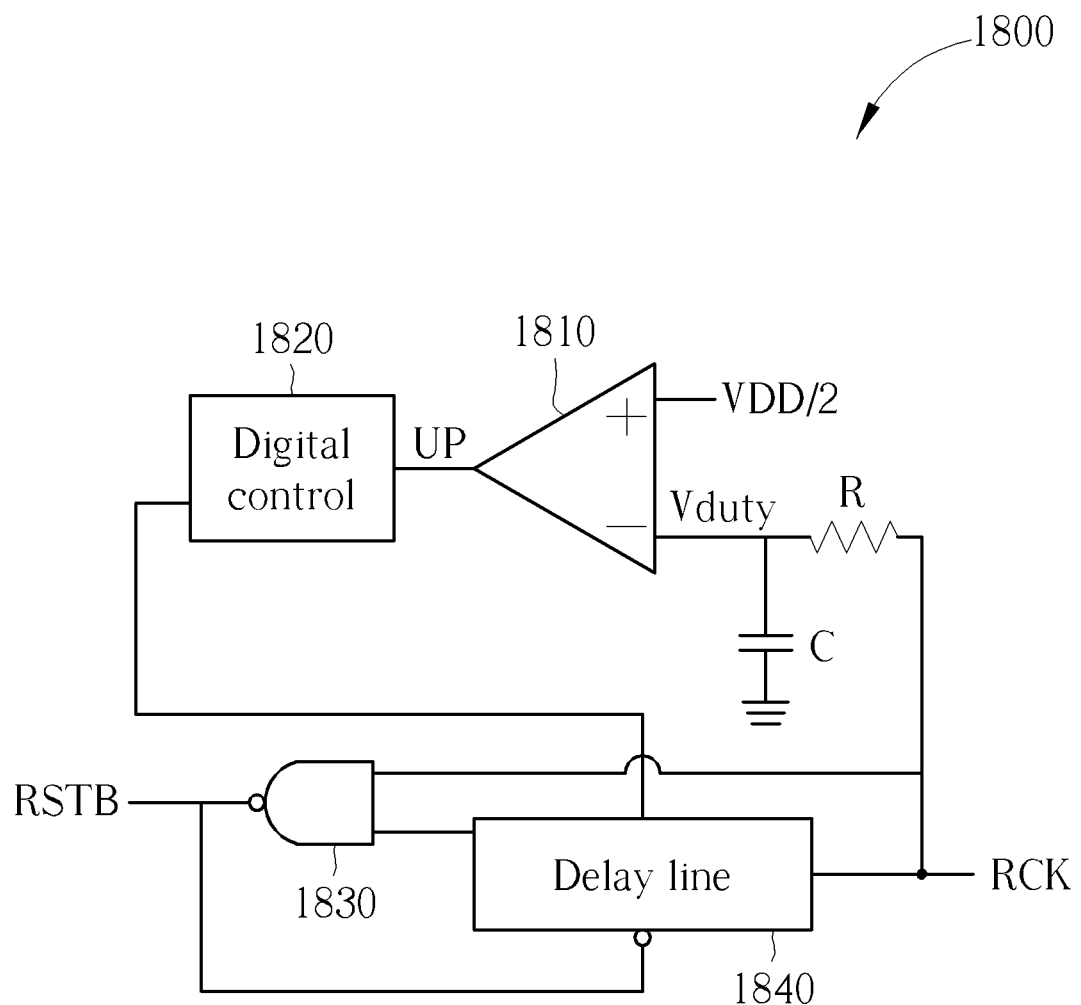
FIG. 17 illustrates a detailed circuit diagram of the duty cycle correction circuit according to another embodiment of the present invention.
Figure 18:
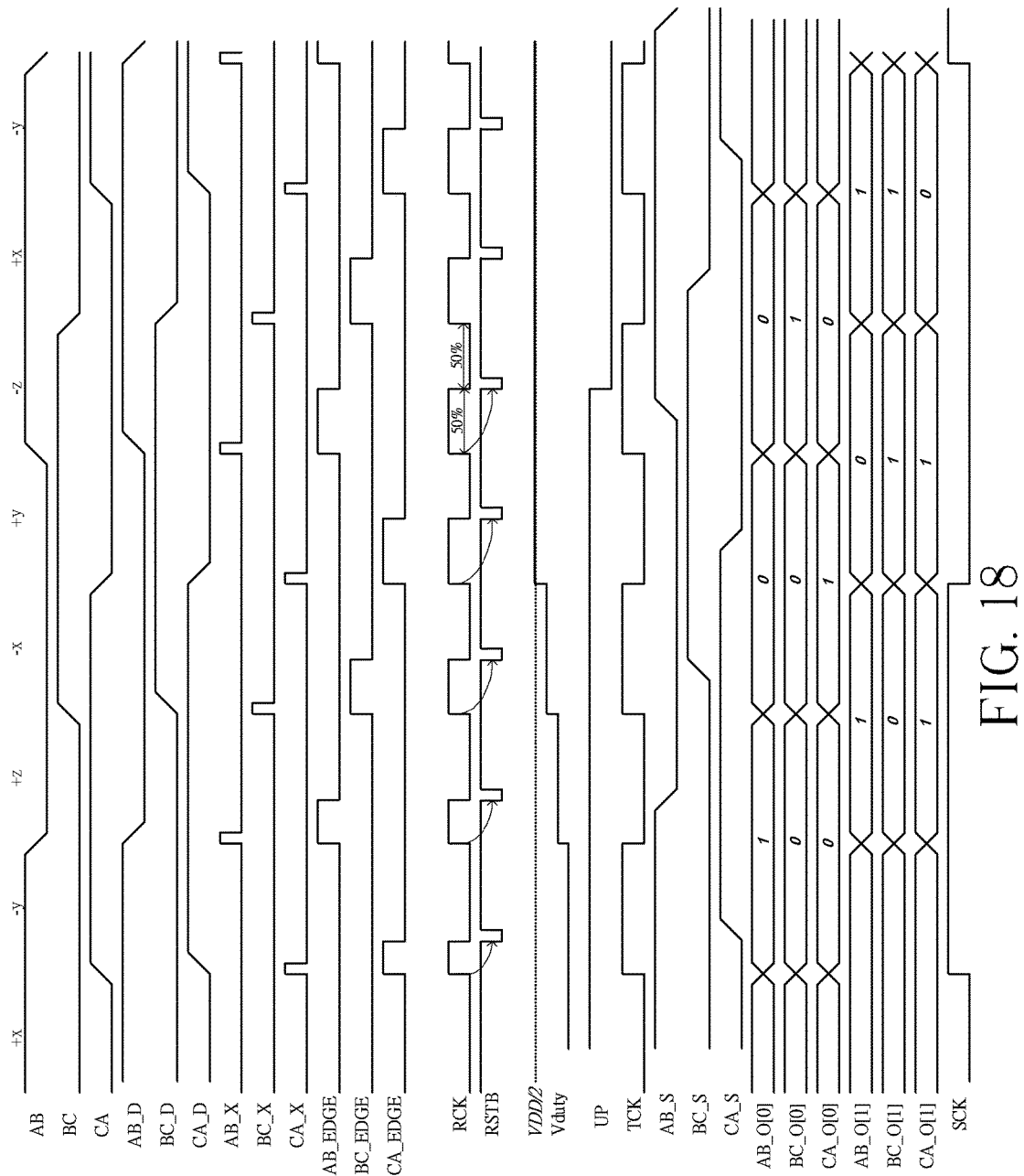
FIG. 18 is a timing diagram for explaining on how the duty cycle correction circuit of FIG. 17 works.

FIG. 17 illustrates a detailed circuit diagram of another embodiment of the duty cycle correction circuit 1250 according to another embodiment of the present invention. The duty cycle correction circuit 1800 comprises a low-pass RC filter comprising a resistive element R and a capacitive element C, which is used to filter the clock signal RCK. The low-pass RC filter generates a filtered signal Vduty. A comparator 1810 compares the signal Vduty with a predetermined signal VDD/2 to generate a comparison result UP. A digital control logic 1820 controls the delay line 1840 according to the comparison result UP. Due to the low-pass RC filter, a duty cycle of the clock signal RCK will be reflected and represented as a voltage level of the signal Vduty. Please refer to FIG. 18. As illustrated, if the comparator 1810 detects that voltage level of the signal Vduty is lower than the predetermined signal VDD/2, it means the duty cycle of the clock signal RCK is lower than 50%. Hence, the output signal UP of the comparator 1810 remain logic "1". According to the output signal UP, the digital control 1820 generates a delay control signal to adjusting the delay time of the delay line 1840. Once the comparator 1810 detects that voltage level of the signal Vduty is equal to the predetermined signal VDD/2, it means the duty cycle of the clock signal RCK is 50%. Hence, the output signal UP of the comparator 1810 goes logic "0". Hence, according to the comparison result UP, the digital control logic 1820 controls the delay line 1840 to generate the proper delay (; having an increase or a decrease in delay until the comparison result UP shows no difference), thereby to produce the reset control signal RSTB to correct the clock signal RCK, so as to achieve 50% duty cycle.

Figure 19:
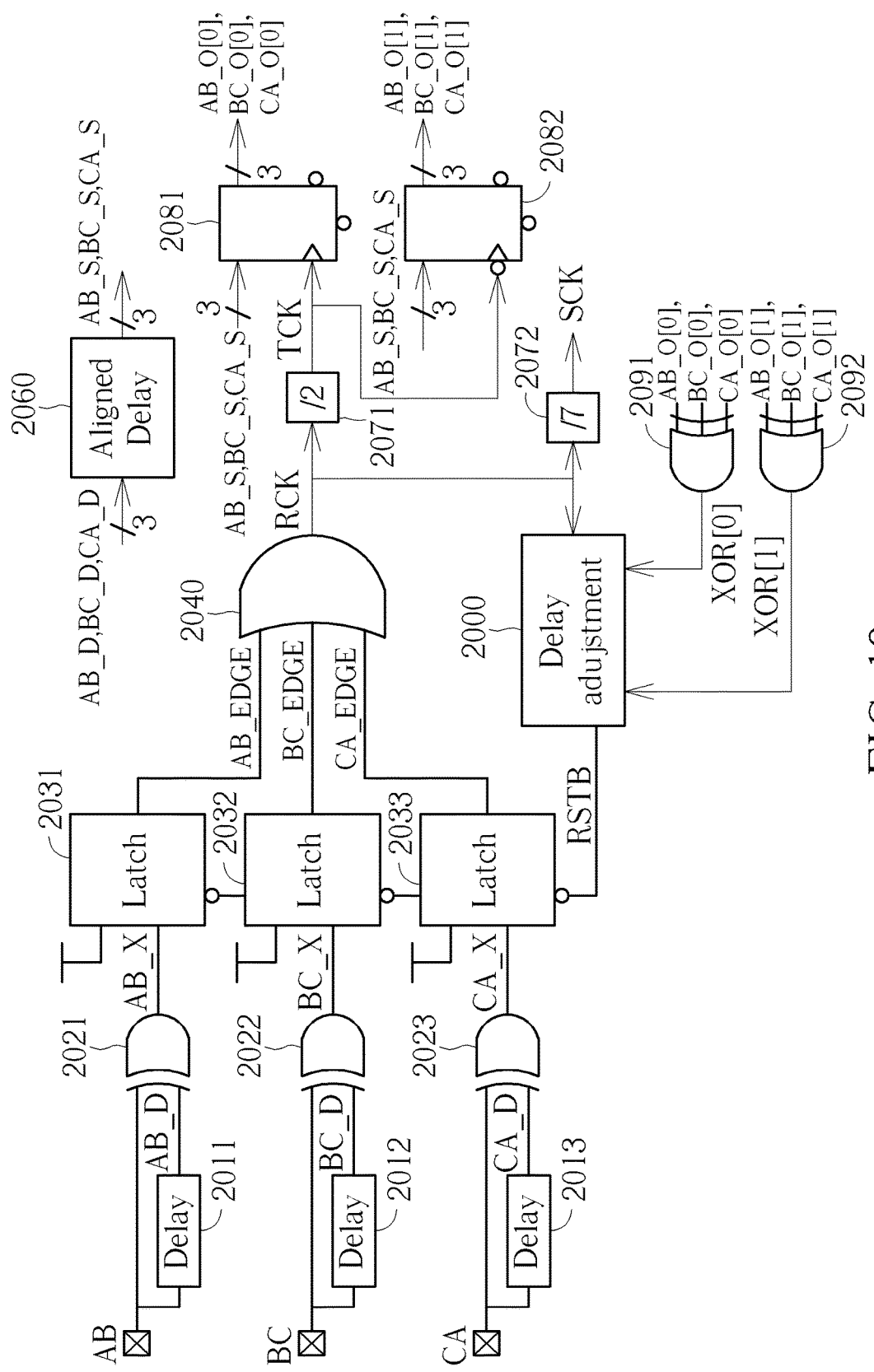
FIG. 19 illustrates a CDR circuit in a receiver of a three-wire communication link according to another embodiment of the present invention.

FIG. 19 illustrates a schematic diagram of a CDR circuit in a receiver of a MIPI C-PHY (or other three-wire lane PHY standards) communication link according to another embodiment of the present invention. The CDR circuit in FIG. 19 includes features and elements that are common to the CDR circuit shown in FIG. 12. However, the main difference there between is the CDR circuit of FIG. 19 utilizes a delay adjustment unit 2000 instead of the duty cycle correction unit to generate the reset control signal. The delay adjustment unit 2000 generates the reset control signal RSTB according to an adjustable delay time and the clock signal RCK.

Figure 20:
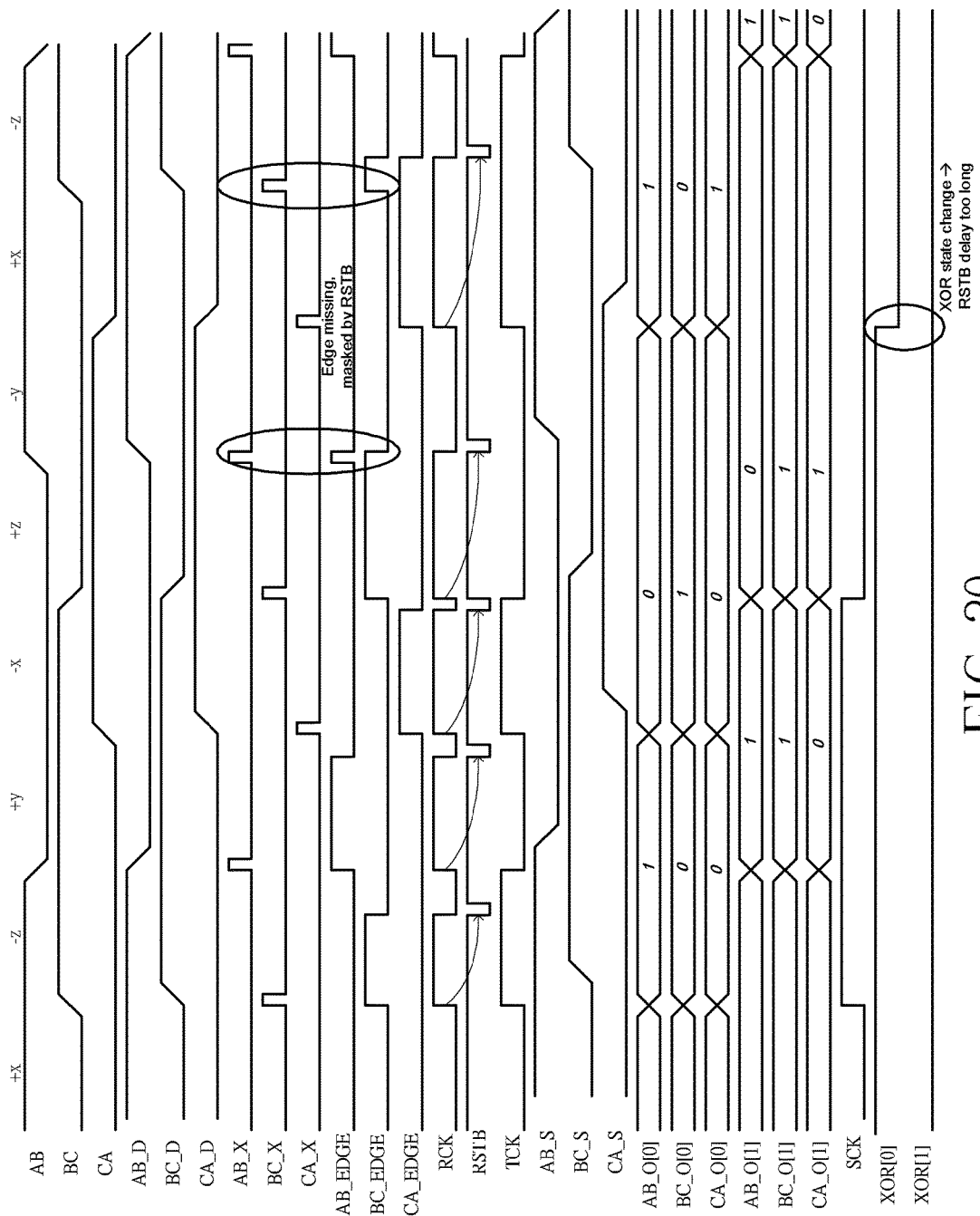
FIG. 20 is a timing diagram for explaining on how the delay adjustment unit of FIG. 19 works.

As explained above, the clock signal RCK transitions to the high logic level and starts a new period at the rising edges of the signals AB_X, BC_X and CA_X. However, as circled in FIG. 20, the rising edges of signals AB_X and CA_X will be masked if the period of the signal BC_edge is too long. This is caused by improper timing of the reset control signal RSTB. The improper timing of the reset control signal RSTB resets the signal BC_edge too slowly, and therefore the rising edges of signals AB_X and CA_X are masked. In order to prevent the rising edges of the signals AB_X, BC_X and CA_X from being masked, the delay adjustment unit 2000 adjusts the reset control signal RSTB according to the sampled results AB_O[0], BC_O[0] and CA_O[0] and the sampled results AB_O[1], BC_O[1] and CA_O[1]. Specifically, the delay adjustment unit 2000 detects an XOR output signal XOR [0] of an XOR gate 2091 and an XOR output signal XOR [1] of an XOR gate 2092. The XOR gate 2091 performs the XOR operations on the sampled results AB_O[0], BC_O[0] and CA_O[0]. The sampled results AB_O[0], BC_O[0] and CA_O[0] is generated by the sampling unit 2081 sampling the signals AB_S, BC_S and CA_S according to the clock signal TCK. The XOR gate 2092 performs the XOR operations on the sampled results AB_O[1], BC_O[1] and CA_O[1]. The sampled results AB_O[1], BC_O[1] and CA_O[1] is generated by the sampling unit 2082 sampling the signals AB_S, BC_S and CA_S according to an inverted version of the clock signal TCK.

The delay adjustment circuit 2000 will begin with an initial delay that guarantees the functionality of the whole CDR circuit of FIG. 19, then slowly increasing the delay timing of the reset control signal RSTB through the circuitry of the delay adjustment circuit 2000. Once the improper timing is reached, it will be reflected as a transition in the XOR output signal XOR [0] and/or the XOR output signal XOR [1]. Once the delay adjustment unit 2000 detects the transition of the XOR output signal XOR [0] and/or the XOR output signal XOR [1], it sets the adjustable delay time as half of the improper timing. As a result, the reset control signal RSTB resets the latches 2031-2033 earlier than the improper timing, which makes the falling edges of the signals AB_EDGE, BC_EDGE and CA_EDGE come earlier without masking the next edge. Furthermore, the clock signal RCK will reach nearly 50% of duty cycle. For example, as in the circled part of FIG. 20, if the reset control signal RSTB resets the latches 2031-2033 earlier than before, the falling edges of the latch output signal BC_edge will come earlier. As such, the XOR output signals AB_X and CA_X will not be masked by the latch output signal BC_edge and also the clock signal RCK can properly track the rising edges of the signals AB_X and CA_X.

Those skilled in the art will readily observe that numerous modifications and alterations of the device and method may be made while retaining the teachings of the invention. Accordingly, the above disclosure should be construed as limited only by the metes and bounds of the appended claims.

What is claimed is:
1. A physical layer circuitry (PHY), comprising:
N signal pads including at least four signal pads; and
a four-signal physical medium attachment sublayer (PMA) coupled to the four signal pads, comprising:
 a four-signal termination circuit coupled to the four signal pads;
 a first differential amplifier coupled to a first signal pad and a second signal pad, arranged to receive signals on the first signal pad and the second signal pad and accordingly output a first differential signal;
 a second differential amplifier coupled to the first signal pad and a third signal pad, arranged to receive signals on the first signal pad and the third signal pad and accordingly output a second differential signal;
 a third differential amplifier coupled to two switches, selectively coupled to the second signal pad and the third pad signal or the third signal pad and a fourth signal pad, arranged to receive signals on the second signal pad and the third signal pad or the third signal pad and the fourth signal pad and accordingly output a third differential signal;
 a first signal processing block coupled to the first differential amplifier, arranged to process the first differential signal when the four-signal PMA is operated in a first PHY mode;
 a second signal processing block coupled to the first, second and third differential amplifiers, arranged to process the first, second and third differential signals when the four-signal PMA is operated in a second PHY mode; and
 a third signal processing block coupled to the third differential amplifier, arranged to process the third differential signal when the four-signal PMA is operated in the first PHY mode.

2. The PHY of claim 1, wherein:
the first signal processing block comprises:
 a first sample and hold circuitry coupled to the first differential amplifier and arranged to output a first serial data signal and a first serial clock signal according to the first differential signal during the first PHY mode;
the third signal processing block comprises:
 a second sample and hold circuitry coupled to the third differential amplifier and arranged to output a second serial data signal and a second serial clock signal according to the third differential signal during the first PHY mode;
the second signal processing block comprises:
 a clock and data recovery (CDR) circuit coupled to the first, second and third differential amplifiers, arranged to output a set of third serial data signals and a third serial clock according to the first, second and third differential signals during the second PHY mode.

3. The PHY of claim 2, wherein:
the first signal processing block further comprises:
 a first deserializer coupled to the first sample and hold circuitry, arranged to deserialize the first serial data signal according to the first serial clock signal, thereby to output a first deserialized data signal and a first deserialized clock signal during the first PHY mode;
the third signal processing block further comprises:
 a third deserializer coupled to the second sample and hold circuitry, arranged to deserialize the second serial data signal according to the second serial clock signal, thereby to output a second deserialized data signal and a second deserialized clock signal during the first PHY mode; and
the second signal processing block further comprises:
 a second deserializer coupled to the CDR circuit, arranged to deserialize the set of third serial data signals according to the third serial clock signal, thereby to output a set of third deserialized data signals and a third deserialized clock signal during the second PHY mode; and
 a decode processor coupled to the second deserializer, thereby to decode a set of the third deserialized data signals during the second PHY mode.

4. The PHY of claim 2, wherein the second signal processing block further comprises:
a deserializer coupled to the CDR circuit arranged to:
 deserialize the first serial data signal and the second serial data according to the serial clock signal, thereby to output a first deserialized data signal, a second deserialized data signal, and a deserialized clock signal during the first PHY mode; and
 deserialize the set of third serial data signals according to the third serial clock signal, thereby to output a set of third deserialized data signals and a third deserialized clock signal during the second PHY mode;
a decode processor coupled to the deserializer, thereby to decode a set of the third deserialized data signals during the second PHY mode.

5. The PHY of claim 1, further comprising:
M shielding pads, including at least a first shielding pad that is coupled to the four-signal PMA; and
wherein the shielding pin is located between the second signal pad of the four signal pads and the third signal pad of the four signal pads; and M and N are positive integers.

6. The PHY of claim 5, wherein each two signal pads of the N signal pads of the PHY are configured in the same lane when the first PHY mode is selected and each three signal pads of the N signal pads of the PHY are configured in the same lane when the second PHY mode is selected.

7. The PHY of claim 1, wherein the four-signal termination circuit comprises:
four adjustable resistive elements, each coupled to one of the four signal pads respectively;
a conducted wire coupled between a terminal of a first adjustable resistive element and a terminal of a second adjustable resistive element;
a first switch selectively coupled between a terminal of the second adjustable resistive element and a terminal of a third adjustable resistive element; and
a second switch selectively coupled between the terminal of the third termination resistive element and a terminal of a fourth termination resistive element;
wherein the first switch is controlled by a switch control signal and the second switch is control by an inverted version of the switch control signal.

8. A physical layer circuitry (PHY), comprising:
N signal pads indcluding at least six signal pads; and
a six-signal physical medium attachment sublayer (PMA), comprising:
a six-signal termination circuit coupled to the six signal pads respectively;
a first differential amplifier coupled to a first signal pad and a second signal pad, arranged to receive signals on the first signal pad and the second signal pad and output a first differential signal;
a second differential amplifier coupled to the first signal pad and a third signal pad, arranged to receive signals on the first signal pad and the third signal pad and output a second differential signal;
a third differential amplifier coupled to two switches, selectively coupled to the second signal pad and the third signal pad or the third signal pad and a fourth signal pad, arranged to receive signals on the second signal pad and the third signal pad or the third signal pad and the fourth signal pad and output a third differential signal;
a fourth differential amplifier coupled to the fourth signal pad and a fifth signal pad, arranged to receive signals on the fourth signal pad and the fifth signal pad and output a fourth differential signal;
a fifth differential amplifier coupled to the fourth signal pad and a sixth signal pad, arranged to receive signals on the fourth signal pad and the sixth signal pad and output a fifth differential signal;
a sixth differential amplifier coupled to the fifth signal pad and the sixth signal pad, arranged to receive signals on the fifth signal pad and the sixth signal pad and output a sixth differential signal;
a first signal processing block coupled to the first differential amplifier, arranged to process the first differential signal when the six-signal PMA is operated in a first PHY mode;
a second signal processing block coupled to the first, second and third differential amplifiers, arranged to process the first, second and third differential signals when the six-signal PMA is operated in a second PHY mode; and
a third signal processing block coupled to the third differential amplifier, arranged to process the third differential signal when the six-signal PMA is operated in the first PHY mode;
a fourth signal processing block coupled to the fourth, fifth and sixth differential amplifiers, arranged to process the fourth, fifth and sixth differential signals when the six-signal PMA is operated in the second PHY mode; and
a fifth signal processing block coupled to the sixth differential amplifier, arranged to process the sixth differential signal when the six-signal PMA is operated in the first PHY mode.

9. The PHY of claim 8, wherein:
the first signal processing block comprises:
a first sample and hold circuitry coupled to the first differential amplifier and arranged to output a first serial data signal and a first serial clock signal according to the first differential signal during the first PHY mode;
the third signal processing block comprises:
a second sample and hold circuitry coupled to the third differential amplifier and arranged to output a second serial data signal and a second serial clock signal according to the third differential signal during the first PHY mode;
the fifth signal processing block comprises:
a third sample and hold circuitry coupled to the sixth differential amplifier and arranged to output a third serial data signal and a third serial clock signal according to the sixth differential signal during the first PHY mode;
the second signal processing block comprises:
a first clock/data recovery circuit coupled to the first, second and third differential amplifiers, arranged to output a set of fourth serial data signals and a fourth serial clock according to the first, second and third differential signals during the second PHY mode;
the fourth signal processing block comprises:
a second clock/data recovery circuit coupled to the fourth, fifth and sixth differential amplifiers, arranged to output a set of fifth serial data signals and a fifth serial clock according to the fourth, fifth and sixth differential signals during the second PHY mode.

10. The PHY of claim 9, wherein:
the first signal processing block further comprises:
a first deserializer coupled to the first sample and hold circuitry, arranged to deserialize the first serial data signal according to the first serial clock signal, thereby to output a first deserialized data signal and a first deserialized clock signal during the first PHY mode;
the third signal processing block further comprises:
a third deserializer coupled to the second sample and hold circuitry, arranged to deserialize the second serial data signal according to the second serial clock signal, thereby to output a second deserialized data signal and a second deserialized clock signal during the first PHY mode;

the fifth signal processing block further comprises:
a fifth deserializer coupled to the third sample and hold circuitry, arranged to deserialize the third serial data signal according to the third serial clock signal, thereby to output a third deserialized data signal and a third deserialized clock signal during the first PHY mode;

the second signal processing block further comprises:
a second deserializer coupled to the first clock/data recovery circuit, arranged to deserialize the set of fourth serial data signals according to the fourth serial clock signal, thereby to output a set of fourth deserialized data signals and a fourth deserialized clock signal during the second PHY mode;
a first decode processor coupled to the second deserializer, thereby to decode a set of the fourth deserialized data signals during the second PHY mode; and the fourth signal processing block further comprises:
a fourth deserializer coupled to the second clock/data recovery circuit, arranged to deserialize the set of fifth serial data signals according to the fifth serial clock signal, thereby to output a set of fifth deserialized data signals and a fifth deserialized clock signal during the second PHY mode; and
a second decode processor coupled to the fourth deserializer, thereby to decode a set of the fifth deserialized data signals during the second PHY mode.

11. The PHY of claim 8, further comprising:
M shielding pads including at least a first shielding pad, a second shielding pad and a third shielding pad; and
wherein the first shielding pad is located between the second and third signal pads of the six signal pads; the second shielding pad is located between the third and fourth signal pads of the six signal pads; the third shielding pad is located between the fourth and fifth signal pads of the six signal pads; M and N are positive integers.

12. The integrated circuit of claim 11, wherein each two signal pads of the N signal pads of the PHY are configured in the same lane when the first PHY mode is selected and each three signal pads of the N signal pads of the PHY are configured in the same lane when the second PHY mode is selected.

13. The PHY of claim 8, wherein the six-signal termination circuit comprises:
six adjustable resistive elements, each coupled to one of the six signal pads respectively;
a first conducted wire coupled between a terminal of a first adjustable resistive element and a terminal of a second adjustable resistive element;
a second conducted wire coupled between a terminal of a fifth adjustable resistive element and a terminal of a sixth adjustable resistive element;
a first switch selectively coupled between the terminal of the second adjustable resistive element and a terminal of a third adjustable resistive element;
a second switch selectively coupled between the terminal of the third adjustable resistive element and a terminal of a fourth adjustable resistive element;
a third switch selectively coupled between the terminal of the fourth adjustable resistive element and a terminal of a fifth adjustable resistive element; and wherein the first switch and the third switch are controlled by a switch control signal and the second switch is controlled by an inverted version of the switch control signal.

14. A clock and data recovery (CDR) circuit for a multi-wire interface, comprising:
a plurality of XOR gates, each coupled to one wire of the multi-wire interface and each having a normal input and a delay input with a delay element, wherein each XOR gate receives a same signal on the wire from the normal input and the delay input and performs an XOR operation on the received signal and a delay version of the received signal, thereby to output an XOR output signal;
a plurality of latches, each coupled to one of the XOR gates and arranged to latch a predetermined signal according to one of XOR output signals to output a latch output signal, wherein the latches are resettable by a reset control signal;
an OR gate coupled to latches, arranged to perform an OR operation on latch output signals to output a clock signal; and
a duty cycle correction unit, coupled to the OR gate, arranged to generate the reset control signal to correct the clock signal, so as to achieve 50% duty cycle for the clock signal.

15. The CDR circuit of claim 14, wherein the duty cycle correction unit comprises:
a programmable delay line, arranged to delay the clock signal to generate a delayed clock signal according to a delay control signal;
a time-to-digital converter, arranged to measure time difference between the XOR output signals to generate a measure result;
a digital control circuit coupled to the time-to-digital converter, arranged to average the measure result and accordingly generate the delay control signal;
a logic circuit, coupled to the programmable delay line arranged perform a logic operation on the clock signal and the delayed clock signal to generate the reset control signal.

16. The CDR circuit of claim 14, wherein the duty cycle correction unit comprises:
a programmable delay line, arranged to delay the clock signal to generate a delayed clock signal according to a delay control signal;
a low-pass filter arranged to filter the clock signal to generate a filtered signal;
a comparator arranged to compare the filtered signal with a predetermined voltage signal to generate a comparison result;
a digital control circuit coupled to the comparator and arranged to generate a delay control signal according to the comparison result; and
a logic circuit, coupled to the programmable delay line and arranged perform a logic operation on the clock signal and the delayed clock signal to generate the reset control signal.

17. A CDR circuit for a multi-wire interface, comprising:
a plurality of XOR gates, each coupled to one wire of the multi-wire interface and each having a normal input and a delay input with a delay element, wherein each XOR gate receives a same signal on the wire from the normal input and the delay input and performs an XOR operation on the received signal and a delay version of the received signal, thereby to output an XOR output signal;

a plurality of latches, each coupled to one of the XOR gates and arranged to latch a predetermined signal according to one of the XOR output signals to output a latch output signal, wherein the latches are resettable by a reset control signal;

an OR gate coupled to latches, arranged to perform an OR operation on latch output signals to output a clock signal; and a delay adjustment unit, coupled to the OR gate, arranged to generate the reset control signal according to a plurality of output signals of a plurality of sampling unit.

18. The CDR circuit of claim 17, wherein the CDR circuit further comprises:

a first sampling unit, coupled to the OR gate, arranged to output a set of first output signals by sampling the signal on the wires of the multi-wire interface according to the clock signal; and a second sampling unit, coupled to the OR gate, arranged to output a set of second output signals by sampling the signal on the wires of the multi-wire interface according to the clock signal;

a first XOR gate, coupled to the first sampling unit, arranged to perform an XOR operations on the set of first output signals to output a first XOR output signal;

a second XOR gate, coupled to the second sampling unit, arranged to perform an XOR operations on the set of second output signals to output a second XOR output signal.

wherein the delay adjustment unit is arranged to generate the reset control signal according to a delay time and the clock signal; and arranged to adjust the delay time according to the first XOR output signal and the second XOR output signal.

\* \* \* \* \*